(12) United States Patent
Kozaki

(10) Patent No.: US 9,130,121 B2
(45) Date of Patent: Sep. 8, 2015

(54) NITRIDE SEMICONDUCTOR DEVICE

(71) Applicant: NICHIA CORPORATION, Anan-shi, Tokushima (JP)

(72) Inventor: Tokuya Kozaki, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 14/220,459

(22) Filed: Mar. 20, 2014

(65) Prior Publication Data

US 2014/0203242 A1 Jul. 24, 2014

Related U.S. Application Data

(60) Continuation of application No. 13/658,921, filed on Oct. 24, 2012, now Pat. No. 8,698,126, and a division of application No. 12/801,496, filed on Jun. 11, 2010, now Pat. No. 8,309,948, and a division of application (Continued)

(30) Foreign Application Priority Data

| Jul. 7, 2000 | (JP) | 2000-207576 |
|---|---|---|
| Oct. 5, 2000 | (JP) | 2000-306372 |
| Nov. 21, 2000 | (JP) | 2000-355078 |
| Jun. 8, 2001 | (JP) | 2001-174903 |

(51) Int. Cl.
*H01L 33/32* (2010.01)
*B82Y 20/00* (2011.01)
(Continued)

(52) U.S. Cl.
CPC .............. *H01L 33/32* (2013.01); *B82Y 20/00* (2013.01); *H01L 33/06* (2013.01); *H01S 5/343* (2013.01);

(Continued)

(58) Field of Classification Search
CPC ......... H01L 33/32; H01L 33/06; H01L 33/24; H01L 29/127; H01L 21/0254; B82Y 20/00; H01S 2324/12; H01S 5/3415
USPC ........ 257/14, 90, 96, 103, E29.072, E29.248; 438/22, 29, 28
See application file for complete search history.

(56) References Cited

U.S. PATENT DOCUMENTS

| 4,675,708 A | 6/1987 | Onabe |
| 4,839,899 A | 6/1989 | Burnham et al. |

(Continued)

FOREIGN PATENT DOCUMENTS

| EP | 0 716 457 | 6/1996 |
| EP | 762516 | 3/1997 |

(Continued)

OTHER PUBLICATIONS

Office Action dated Feb. 16, 2012, issued in U.S. Appl. No. 12/801,496, filed Jun. 11, 2010, now USP 8,309,948, issued Nov. 13, 2012.

(Continued)

*Primary Examiner* — Thin T Nguyen
(74) *Attorney, Agent, or Firm* — Nixon & Vanderhye PC

(57) ABSTRACT

In the nitride semiconductor device of the present invention, an active layer 12 is sandwiched between a p-type nitride semiconductor layer 11 and an n-type nitride semiconductor layer 13. The active layer 12 has, at least, a barrier layer 2a having an n-type impurity; a well layer 1a made of a nitride semiconductor that includes In; and a barrier layer 2c that has a p-type impurity, or that has been grown without being doped. An appropriate injection of carriers into the active layer 12 becomes possible by arranging the barrier layer 2c nearest to the p-type layer side.

20 Claims, 13 Drawing Sheets

Related U.S. Application Data

No. 11/898,402, filed on Sep. 12, 2007, now Pat. No. 7,750,337, and a division of application No. 11/348,331, filed on Feb. 7, 2006, now Pat. No. 7,646,009, and a division of application No. 10/978,732, filed on Nov. 2, 2004, now Pat. No. 7,119,378, and a division of application No. 10/443,083, filed on May 22, 2003, now Pat. No. 6,838,693, and a division of application No. 09/898,460, filed on Jul. 5, 2001, now Pat. No. 6,586,762.

(51) Int. Cl.
*H01L 33/06* (2010.01)
*H01S 5/343* (2006.01)
*H01L 33/24* (2010.01)
*H01S 5/183* (2006.01)
*H01S 5/20* (2006.01)
*H01S 5/22* (2006.01)
*H01S 5/30* (2006.01)
*H01S 5/34* (2006.01)

(52) U.S. Cl.
CPC ............ *H01S 5/34333* (2013.01); *H01L 33/24* (2013.01); *H01S 5/18308* (2013.01); *H01S 5/18369* (2013.01); *H01S 5/2009* (2013.01); *H01S 5/22* (2013.01); *H01S 5/305* (2013.01); *H01S 5/3054* (2013.01); *H01S 5/3086* (2013.01); *H01S 5/3407* (2013.01); *H01S 5/3415* (2013.01); *H01S 2304/12* (2013.01)

(56) References Cited

U.S. PATENT DOCUMENTS

| | | | |
|---|---|---|---|
| 5,578,839 A | 11/1996 | Nakamura et al. | |
| 5,684,309 A | 11/1997 | McIntosh et al. | |
| 5,751,752 A | 5/1998 | Shakuda | |
| 5,777,350 A | 7/1998 | Nakamura et al. | |
| 5,780,876 A | 7/1998 | Hata | |
| 5,786,603 A | 7/1998 | Rennie et al. | |
| 5,786,606 A | 7/1998 | Nishio et al. | |
| 5,793,061 A | 8/1998 | Ohuchi et al. | |
| 5,841,802 A | 11/1998 | Whiteley et al. | |
| 5,889,806 A | 3/1999 | Nagai et al. | |
| 5,945,689 A | 8/1999 | Koike et al. | |
| 5,959,307 A | 9/1999 | Nakamura et al. | |
| 5,959,401 A | 9/1999 | Asami et al. | |
| 5,990,496 A | 11/1999 | Kunisato et al. | |
| 6,040,588 A | 3/2000 | Koide et al. | |
| 6,153,894 A | 11/2000 | Udagawa | |
| 6,162,656 A | 12/2000 | Kunisato et al. | |
| 6,172,382 B1 | 1/2001 | Nagahama et al. | |
| 6,242,761 B1 | 6/2001 | Fujimoto et al. | |
| 6,252,894 B1 | 6/2001 | Sasanuma et al. | |
| 6,320,893 B1 | 11/2001 | Ueki | |
| 6,326,236 B1 | 12/2001 | Koide et al. | |
| 6,420,733 B2 | 7/2002 | Koide et al. | |
| 6,423,984 B1 * | 7/2002 | Kato et al. | 257/103 |
| 6,441,393 B2 | 8/2002 | Goetz et al. | |
| 6,541,293 B2 | 4/2003 | Koide et al. | |
| 6,586,762 B2 | 7/2003 | Kozaki | |
| 6,821,800 B2 | 11/2004 | Koide et al. | |
| 6,838,693 B2 * | 1/2005 | Kozaki | 257/14 |
| 6,853,009 B2 | 2/2005 | Kato et al. | |
| 7,119,378 B2 | 10/2006 | Kozaki | |
| 2001/0048112 A1 | 12/2001 | Koide et al. | |
| 2002/0014632 A1 | 2/2002 | Kaneyama et al. | |
| 2002/0146854 A1 | 10/2002 | Koide et al. | |
| 2002/0149024 A1 | 10/2002 | Kato et al. | |
| 2003/0124789 A1 | 7/2003 | Koide et al. | |
| 2004/0026705 A1 | 2/2004 | Kato et al. | |
| 2010/0252811 A1 | 10/2010 | Kozaki | |
| 2013/0056707 A1 | 3/2013 | Kozaki | |

FOREIGN PATENT DOCUMENTS

| | | |
|---|---|---|
| EP | 803916 | 10/1997 |
| EP | 1041650 | 10/2000 |
| EP | 1122841 | 8/2001 |
| EP | 1168539 | 1/2002 |
| GB | 2323210 | 9/1998 |
| JP | 63-152194 | 6/1988 |
| JP | 63-211784 | 9/1988 |
| JP | 02-228087 | 9/1990 |
| JP | 03-166785 | 7/1991 |
| JP | 5-206513 | 8/1993 |
| JP | 06-021511 | 1/1994 |
| JP | 06-164055 | 6/1994 |
| JP | 06-268257 | 9/1994 |
| JP | 06-268332 | 9/1994 |
| JP | 07-147454 | 6/1995 |
| JP | 8-111558 | 4/1996 |
| JP | 08-125281 | 5/1996 |
| JP | 08-181386 | 7/1996 |
| JP | 08-293643 | 11/1996 |
| JP | 8-293643 | 11/1996 |
| JP | 08-316528 | 11/1996 |
| JP | 8293623 | 11/1996 |
| JP | 09-008412 | 1/1997 |
| JP | 9-36423 | 2/1997 |
| JP | 09-036423 | 2/1997 |
| JP | 09-036430 | 2/1997 |
| JP | 9-129926 | 5/1997 |
| JP | 9-266326 | 7/1997 |
| JP | 09-260766 | 10/1997 |
| JP | 9-293935 | 11/1997 |
| JP | 10-4210 | 1/1998 |
| JP | 10-012922 | 1/1998 |
| JP | 10-012923 | 1/1998 |
| JP | 10-12969 | 1/1998 |
| JP | 10012922 | 1/1998 |
| JP | 10-126006 | 5/1998 |
| JP | 10-135514 | 5/1998 |
| JP | 10-163523 | 6/1998 |
| JP | 10-242512 | 9/1998 |
| JP | 10-242565 | 9/1998 |
| JP | 10-256601 | 9/1998 |
| JP | 11-054847 | 2/1999 |
| JP | 11-266034 | 9/1999 |
| JP | 11-274644 | 10/1999 |
| JP | 11-298090 | 10/1999 |
| JP | 11298090 | 10/1999 |
| JP | 11-330610 | 11/1999 |
| JP | 11-340559 | 12/1999 |
| JP | 11340559 | 12/1999 |
| JP | 2000-91629 | 3/2000 |
| JP | 2000-91630 | 3/2000 |
| JP | 2000-91631 | 3/2000 |
| JP | 2000-091705 | 3/2000 |
| JP | 2000091630 | 3/2000 |
| JP | 2000-151023 | 5/2000 |
| JP | 2000-156544 | 6/2000 |
| JP | 2000-208875 | 7/2000 |
| JP | 2000-244011 | 9/2000 |
| JP | 2000-286447 | 10/2000 |
| JP | 2000-349377 | 12/2000 |
| JP | 2000-349398 | 12/2000 |
| JP | 2001-44570 | 2/2001 |
| JP | 2001-077413 | 3/2001 |
| JP | 2001044570 | 12/2001 |
| WO | WO00/17972 | 3/2000 |
| WO | WO00/52796 | 9/2000 |
| WO | WO 00/76004 A1 | 12/2000 |

OTHER PUBLICATIONS

Office Action dated Jul. 7, 2011, issued in U.S. Appl. No. 12/801,496, filed Jun. 11, 2010, now USP 8,309,948, issued Nov. 13, 2012.

Office Action dated Aug. 6, 2009 issued in U.S. Appl. No. 11/898,402, filed Sep. 12, 2007, now USP 7,750,337, issued Jul. 6, 2010.

(56) References Cited

OTHER PUBLICATIONS

Office Action dated Mar. 15, 2005 issued in Re-examination U.S. Appl. No. 90/007,369, filed Jan. 7, 2005, now USP 6,586,762, issued Jul. 1, 2003.
Notice of Allowance dated Aug. 25, 2005 issued in U.S. Appl. No. 10/978,732, filed Nov. 2, 2004, now USP 7,119,378, issued Oct. 10, 2006.
Notice of Allowance dated Aug. 25, 2009 issued in U.S. Appl. No. 11/348,331, filed Feb. 7, 2006, now USP 7,646,009, issued Jan. 12, 2010.
Office Action dated Oct. 24, 2013 issued in U.S. Appl. No. 13/658,921, filed Oct. 24, 2012, now USP 8,698,126, issued Apr. 15, 2004.
Office Action dated May 9, 2013 issued in U.S. Appl. No. 13/658,921, filed Oct. 24, 2012, now USP 8,698,126, issued Apr. 15, 2004.
European Search Report dated Mar. 27, 2012, issued in EP Application No. 10182174.2-2222.
Salvador et al, "Properties of a Si doped GaN/AlGaN . . . ", Appl. Phys Lett., vol. 67, No. 22, Nov. 1995, pp. 3322-3324.
Gotoh et al, "Improvement of quantum efficiency by InGaN . . . ", Extended Abstracts (The 48$^{th}$ spring Meeting 2001); The Japan Society of Applied Physics and Related Societies, No. 1(01.03.28), 28p-E-12, pp. 369 and its English Abstract.
U.S. Appl. No. 09/898,460, filed Jul. 5, 2001.
U.S. Appl. No. 10/443,083, filed May 22, 2003.
U.S. Appl. No. 11/648,697, filed Jan. 3, 2007.
U.S. Appl. No. 10/978,732, filed Nov. 2, 2004.
U.S. Appl. No. 11/348,331, filed Feb. 7, 2006.
U.S. Appl. No. 12/801,496, filed Jun. 11, 2010.
U.S. Appl. No. 11/898,402, filed Sep. 12, 2007.
Office Action issued in U.S. Appl. No. 11/648,697, dated Dec. 10, 2009.
Office Action issued in Reexamination U.S. Appl. No. 90/007,369 (U.S. Patent No. 6,586,762) dated Apr. 28, 2006.
European Search Report issued on Oct. 2, 2009 in EP 09 01 0212.
Office Action issued in U.S. Appl. No. 09/898,460 (U.S. Patent No. 6,586,762) dated Sep. 13, 2002.
Office Action issued in U.S. Appl. No. 12/801,496, dated Jul. 7, 2011.
Office Action issued in U.S. Appl. No. 12/801,496, dated Feb. 16, 2012.
Office Action issued in Japanese Appln. No. 2006-035043 (Oct. 18, 2011).
Office Action and Partial Translation filed in corresponding Japanese Application No. 2001-174903.
Search Report cited in corresponding PCT/JP01/05869.
Nakamura, S., "GaN-Based Blue/Green Semiconductor Laser," IEEE Journal of Selected Topics in Quantum Electronics, IEEE Service Center, US, vol. 3, No. 2, Apr. 1997, pp. 435-442.
Supplementary European Search Report EP 01947872 (Nov. 8, 2005).
Office Action issued in Reexamination U.S. Appl. No. 90/007,369 (U.S. Patent No. 6,586,762) dated Jul. 3, 2007.
Office Action issued in U.S. Appl. No. 10/443,083 (U.S. Patent No. 6,838,693) dated Sep. 26, 2003.
Office Action issued in U.S. Appl. No. 10/443,083 (U.S. Patent No. 6,838,693) dated Mar. 1, 2004.
Office Action issued in U.S. Appl. No. 11/348,331, dated Jan. 28, 2008.
Office Action issued in U.S. Appl. No. 11/348,331, dated Aug. 27, 2008.

\* cited by examiner

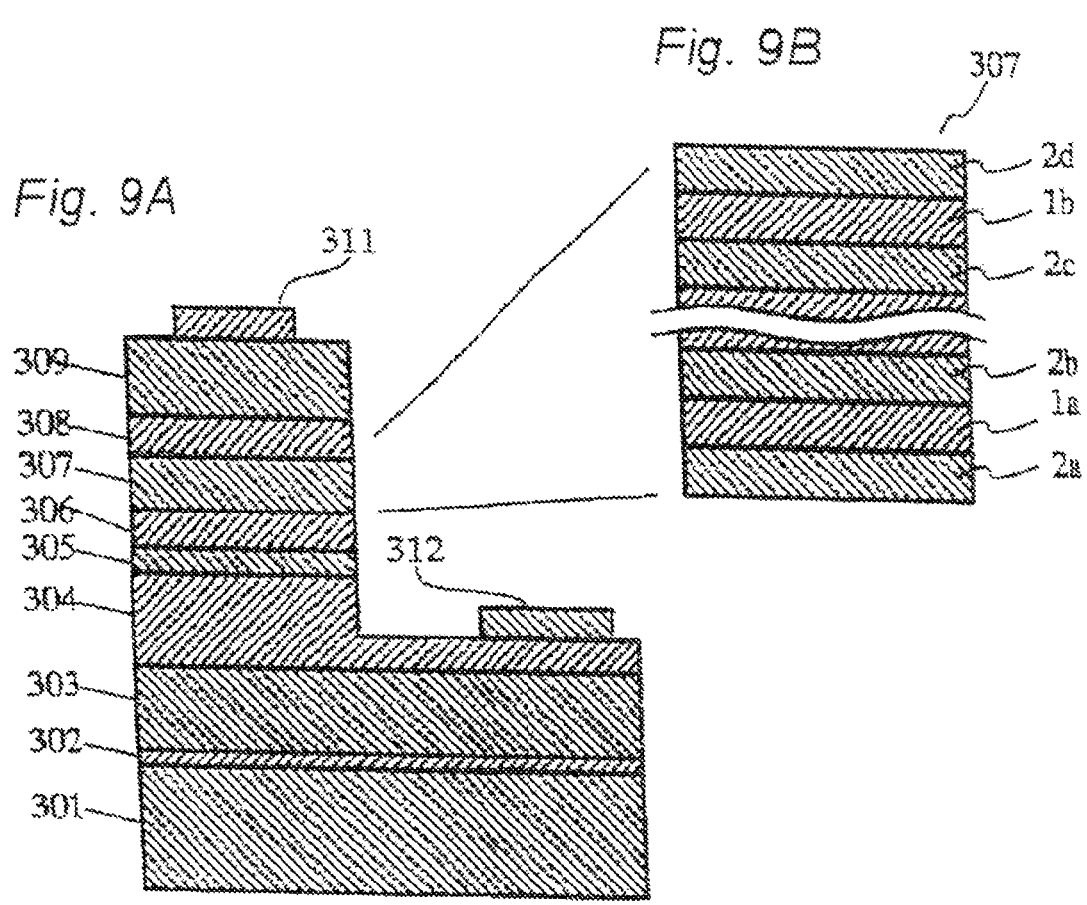

NITRIDE SEMICONDUCTOR DEVICE

CROSS-REFERENCES TO RELATED APPLICATIONS

This application is a continuation application of application Ser. No. 13/658,921, filed Oct. 24, 2012, which is a divisional of U.S. application Ser. No. 12/801,496, filed Jun. 11, 2010, now U.S. Pat. No. 8,309,948, which is a divisional of U.S. application Ser. No. 11/898,402, filed Sep. 12, 2007, now U.S. Pat. No. 7,750,337, which is a divisional of U.S. application Ser. No. 11/348,331, filed Feb. 7, 2006, now U.S. Pat. No. 7,646,009, which is a divisional of U.S. application Ser. No. 10/978,732, filed Nov. 2, 2004, now U.S. Pat. No. 7,119,378, which is a divisional of U.S. application Ser. No. 10/443,083, filed May 22, 2003, now U.S. Pat. No. 6,838,693, which is a divisional of U.S. application Ser. No. 09/898,460, filed Jul. 5, 2001, now U.S. Pat. No. 6,586,762 and claims priority to Japanese Application Nos. 2001-174903, filed Jun. 8, 2001, 2000-355078, filed Nov. 21, 2000, JP 2000-306372, filed Oct. 5, 2000 and 2000-207576, filed Jul. 7, 2000, the entire contents of each of which are hereby incorporated by reference in this application.

BACKGROUND OF THE INVENTION

1. Field of the Invention

The present invention relates to a nitride semiconductor device which uses a nitride semiconductor ($In_XAl_YGa_{1-X-Y}N$, $0 \leq X$, $0 \leq Y$, $X+Y \leq 1$) used in light emitting devices such as light emitting diode device (LED) and laser diode device (LD), light receiving devices such as solar cell and optical sensor or electronic devices such as transistor and power devices, and particularly to a nitride semiconductor device comprising a nitride semiconductor layer which includes In.

2. Description of the Prior Art

Recently semiconductor laser devices which use nitride semiconductors have been receiving increasing demands for the applications in optical disk systems such as DVD systems which are capable of recording and reproducing a large amount of information with a high density. Accordingly, vigorous research efforts are being made in the field of semiconductor laser devices which use nitride semiconductors. Because of the capability to oscillate and emit visible light over a broad spectrum ranging from ultraviolet to red, the nitride semiconductor laser device is expected to have wide applications, such as light sources for laser printers and optical networks, as well as the light sources for optical disk systems. The applicant of the present invention reported a laser which successfully underwent over ten thousand hours of operation under the conditions of continuous oscillation at a wavelength of 405 nm with output power of 5 mW at room temperature.

Light emitting devices and light receiving devices which use nitride semiconductors have a nitride semiconductor structure which includes In for the active layer and, accordingly, it is important to form a better active region in the active layer in order to improve device characteristics.

In the prior art, n-type nitride semiconductors doped with n-type impurities have been used for the active layer of the nitride semiconductor device. Particularly in the case of a quantum well structure device, n-type nitride semiconductors doped with n-type impurities have been used in the well layer and the barrier layer.

In order for light emitting devices which employ nitride semiconductors to have wide applications they must be further improved with respect to device characteristics, particularly in device lifetime.

It is essential to have a longer lifetime and a higher output power for the laser devices which use nitride semiconductors as light sources for reading or writing information in high-density optical disk systems, described above, and further applications. Other classes of nitride semiconductor devices are also required to have longer lifetimes and higher output power, and light emitting devices are required to have a higher output power of light emission.

Weak reverse withstanding voltage of the devices using nitride semiconductors has been a problem in the prior art, in that such devices have a high probability of destruction during handling in the manufacturing process and mounting on an end product.

The present invention has been made in consideration of the problems described above, and aims at obtaining a nitride semiconductor device which has excellent device characteristics including the threshold current density and has longer device lifetime and high output power.

BRIEF SUMMARY OF THE INVENTION (1) A light emitting device according to the present invention is a type of nitride semiconductor device having a structure where an active layer of a quantum well structure, which comprises a well layer made of a nitride semiconductor that includes In, and a barrier layer made of a nitride semiconductor, is sandwiched by a p-type nitride semiconductor layer and an n-type nitride semiconductor layer, wherein the light emitting device according to the present invention is characterized in that the above active layer has a first barrier layer, that is arranged in a position nearest to the above p-type nitride semiconductor layer, and a second barrier layer, that is different from the first barrier layer, as the above barrier layer and is characterized in that the above first barrier layer does not substantially include an n-type impurity while the above second barrier layer includes an n-type impurity. Here, though, barrier layers, other than the first barrier layer and the second barrier layer among the barrier layers in the active layer, are not particularly limited, in the case of usage as a laser device or as a light emitting device of high power, they are preferably doped with an n-type impurity or are not doped with any impurities.

Though, in a conventional multiple quantum well-type (hereinafter referred to as MQW-type) nitride semiconductor device, all the barrier layers are, in general, doped with an n-type impurity, such as Si, in order to enhance light emission efficiency by increasing the initial electron concentration in the active layer, a nitride semiconductor device of the present invention has a barrier layer, that is doped with an n-type impurity in the same manner as in the prior art, while an n-type impurity is not substantially included only in the first barrier layer that is nearest to the p-type nitride semiconductor layer. In such a structure, characteristics with respect to the device lifetime and the reverse withstanding voltage of the nitride semiconductor device can be improved.

Though the mechanism where the lifetime characteristic is improved is not necessarily evident, it can be inferred that, for one reason, the fact that the lifetime of the carriers has become longer than in the prior art contributes to this mechanism. Conventionally a barrier layer, that is doped with an n-type impurity, is arranged on the side of the p-type layer so that diffusion of the p-type impurity from the p-type layer occurs to quite a great degree and, thereby, a barrier layer, that includes an n-type impurity and a p-type impurity, is provided, which causes the lowering of the lifetime of the carriers. According to the present invention, since the first barrier layer is not doped with an n-type impurity, n-type and p-type impurities can be prevented from coexisting in the same barrier layer.

In addition, among barrier layers in the active layer, the barrier layer arranged on the side of the p-type layer (first barrier layer) does not substantially include an n-type impurity so as to have a function different from that of the barrier layer (second barrier layer), which has an n-type impurity, in the active layer. That is to say, by having the second barrier layer, the carriers injected from the n-type layer into the active layer are increased and the carriers that reach deep into the active layer (to the p-type layer side) are increased so that the injection efficiency of the carriers can be increased while, by having the first barrier layer, a barrier layer, in which an n-type impurity is not included, is arranged as a barrier layer nearest to the p-type layer in the active layer so that it becomes possible to increase the injection of the carriers from the p-type layer and also to improve the efficiency.

In the case that an n-type impurity is included in the first barrier layer, the injection of the carriers from the p-type layer tends to be blocked. In particular, the diffusion distance of the carriers from the p-type layer tends to be short in comparison with the carriers from the n-type layer and, therefore, when the first barrier layer, which corresponds to the entrance for the injection of the carriers from the p-type layer to the active layer, has an n-type impurity, the injection of the carriers from the p-type layer is negatively affected to a serious degree. As shown in FIG. 14, it is understood that the device lifetime is suddenly lowered as the n-type impurity concentration in the first barrier layer is increased.

Accordingly, by providing the first barrier layer in the active layer, it is observed that a great number of holes can be provided and the lifetime of the carriers tends to become longer such that they are considered to contribute to the increase of the above characteristics.

Though the second barrier layer may adjoin the first barrier layer, it is preferably provided at a distance away from the first barrier layer by making at least one, or more, well layer intervene. Thereby, the first barrier layer arranged on the p side and the second barrier layer arranged on the n side are provided with a well layer placed between them within the active layer so that an effective carrier injection becomes possible so as to reduce the loss in a laser device as a light source for, for example an optical disk system, and the device characteristics, in particular the device lifetime and the power, are subsequently increased. At this time, the second barrier layer is preferably a barrier layer nearest to the n-type layer among the barrier layers in the active layer so as to be the entrance for the injection of the carriers from the n-type layer so that a great amount of carrier injection or an effective injection becomes possible and the device characteristics are improved.

Here, the fact that an n-type impurity is not substantially included indicates that an n-type impurity is not included due to the exceeding of the concentration resulting from the contamination, or the like, during the process and, for example, in the case that the n-type impurity is Si, the fact indicates that the concentration is $5 \times 10^{16}$ cm$^{-3}$, or less.

(2) It is preferable for the film thickness of the above first barrier layer to be greater than the film thickness of the second barrier layer. In this structure increase of the device lifetime can be implemented. In the case that the first barrier layer has a film thickness less than that of the other barrier layer (second barrier layer), lowering of the device lifetime can be observed. In particular, this tendency is significant in the case that the first barrier layer is arranged in the outermost position. In addition, in the case that the first barrier layer is positioned in the outermost position in the active layer, that is to say, on the top, when a p-type nitride semiconductor layer is provided on the active layer, the reduction of the above device lifetime is furthered. For example, as shown in FIG. 8, in the case that the first barrier layer 2c is arranged nearest to the p-type electron confining layer (first p-type nitride semiconductor layer), the first barrier layer becomes an important layer where the film thickness thereof determines the characteristics of the active layer and the well layer since this p-type electron confining layer is a layer that strongly affects the active layer, particularly the well layer, as described below.

That is to say, in the nitride semiconductor device according to the present invention, carriers can be effectively confined in the active layer when the barrier layers in the active layer are formed of a nitride semiconductor that includes In and the layer, at least, adjoining the active layer among p-type nitride semiconductor layers is formed of a nitride semiconductor (electrons confining layer) that includes Al. However, when a nitride semiconductor that includes Al is made to grow after a nitride semiconductor that includes In is made to grow, the nitride semiconductor that includes In is easily resolved because of the high vapor pressure of InN and because of the difference in the growth conditions of these nitride semiconductors. Therefore, it is preferable for the first barrier layer to be formed thicker than the other barrier layers.

For example, in the case of the growth by means of an MOCVD method, it is general that InGaN is made to grow under the conditions of a slow gas flow rate at a low temperature in a nitrogen gas atmosphere while AlGaN is made to grow under the conditions of a fast gas flow rate at a high temperature in a hydrogen gas atmosphere. Accordingly, for example, when, after growing InGaN as the first barrier layer, AlGaN is made to grow as a p-type nitride semiconductor layer, InGaN is resolved through a gas etching at the time when the growth condition within the reaction vessel is switched to another condition. Therefore, by forming the first barrier layer thicker than the other barrier layers, an excellent quantum well structure can be maintained even in the case that the first barrier layer is slightly resolved. That is to say, the first barrier layer plays the role of a protective layer that prevents the active layer, which includes In, from being resolved.

Furthermore, in the case that the first barrier layer arranged nearest to the p-type nitride semiconductor layer has a great film thickness, the distance vis-à-vis the p-type electron confining layer can be increased so that carriers of a high concentration can be stably injected in the continuous drive of the device since a sufficiently broad space can be secured even for a great amount of p-type carriers. Accordingly, device reliability, such as a long device lifetime, can be improved.

(3) In addition, when the barrier layer arranged in the position nearest to the n-type nitride semiconductor layer is assumed to be a barrier layer B1 and the i-th (i=1, 2, 3 . . . L) barrier layer counted from the barrier layer B1 toward the above p-type nitride semiconductor layer is assumed to be a barrier layer Bi, it is preferable for barrier layers Bi from i=1 to i=n (1<n<L) to have an n-type impurity. Because of this structure the injection of the carriers to each well layer in the active layer becomes more efficient. In addition, the injection of the carriers deep into the active layer (p-type layer side) is effectively carried out so that the device can deal with a great amount of carrier injection. Accordingly, the light emission efficiency is improved, for example, in an LED or in a LD and it becomes possible to lower the oscillation threshold current density and the forward direction voltage while increasing the device lifetime. In addition, the provision of an n-type impurity in the barrier layers Bi from the first to the n-th contributes to the lowering of the threshold current density because the carriers are immediately injected into the well layers at the initial phase of the drive of the device.

(4) In addition, all of the barrier layers, other than the first barrier layer, are preferably doped with an n-type impurity. Thereby, the carrier injection from the n-type layers can further be increased and can be made more effective.

(5) It is preferable for the above first barrier layer to be arranged in the outermost position of the above active layer. The first barrier layer is arranged on the side nearest to the p-type nitride semiconductor layer within the active layer so that the first barrier layer becomes the entrance for the injection of the carriers and, thereby, the injection of the carriers from the p-type layer to the active layer becomes effective and a great amount of carriers can be injected so as to improve device characteristics, such as the threshold current density, the device lifetime and power. In addition, a nitride semiconductor device can be gained which has the device reliability that can withstand severe drive conditions, such as a great amount of current or a high power. At this time, it is preferable for the p-type nitride semiconductor layer to be formed so as to contact the active layer and the below described first p-type nitride semiconductor layer can be provided as a layer that contacts the first barrier layer.

(6) Furthermore, it is preferable for the above second barrier layer to be arranged in the outermost position close to the above n-type nitride semiconductor layer within the above active layer. In this structure, the active layer is provided wherein the first p side barrier layer and the second n side barrier layer are respectively arranged on the p-type nitride semiconductor layer side and on the n-type nitride semiconductor layer side so that the carriers from the p-type layer and n-type layer are effectively injected toward the center portion of the active layer.

(7) It is preferable in the above structure (6) for the film thickness of the above first p side barrier layer to be approximately the same as the film thickness of the above second n side barrier layer. In this structure, the active layer becomes more symmetrical and, as a result, the dispersion of the devices can be restrained so as to increase the yield and the threshold current density is reduced.

(8) In addition, it is preferable in the above structure (6) for the above active layer to have two, or more, well layers so as to have a third barrier layer between these well layers and it is also preferable for the film thickness of the above third barrier layer to be less than the film thicknesses of the above first p side barrier layer and of the second n side barrier layer. In this structure, it becomes possible for the second n side barrier layer and the first p side barrier layer, as well as the third barrier layer, to have different functions so that it becomes possible to restrain the dispersion of the device characteristics and to reduce the threshold current density Vf. That is to say, the second n side barrier layer and the first p side barrier layer are arranged in the outermost position in the active layer so as to be the entrances for the injections of the carriers from the n-type layer and p-type layer while the film thickness is greater than the third barrier layer so that a broad space for holding a great amount of carriers is secured and, contrarily, the film thickness of the third barrier layer is small so that the film thickness of the entirety of the active layer can be reduced so as to contribute to the reduction of Vf.

(9) It is preferable for at least one well layer within the above active layer to have a film thickness of 40 Å, or more. Conventionally, the film thickness of the well layer is regarded as optimal in a preferable range of from approximately 20 Å to 30 Å since the characteristics (for example, oscillation threshold current) at the initial stage of oscillation and the light emission are taken into consideration which results in the fact that a continuous drive with a great current accelerates the device deterioration and prevents the increase of the device lifetime. The present invention solves this problem due to the above structure.

That is to say, the structure of the present invention makes an effective carrier injection possible and, additionally, by providing a well layer of which the film thickness is suitable for the carrier injection, it becomes possible to increase the stability in the drive of a light emitting device and a laser device of high power and loss in output, relative to the injected current, can be reduced so that a great increase in the device lifetime can be made possible. An effective light emitting recombination, without loss, of the great amount of carriers injected in the well layer is required for light emission and oscillation at high power and the above structure is suitable for implementing such light emission and oscillation.

The upper limit of the film thickness of the well layer depends on the film thicknesses of the barrier layers and of the active layer and is preferably 500 Å, or less, though it is not particularly limited to this. In particular, it is preferably 300 Å, or less, when it is taken into consideration that a plurality of layers are layered in the quantum well structure. Furthermore, in the case that the film thickness of a well layer is in the range of no less than 50 Å and no more than 200 Å, it is possible to form, preferably, an active layer in either a multiple quantum well structure or in a single quantum well structure. In the case of the multiple quantum well structure in particular, the film thickness of a well layer is preferably in the range of no less than 50 Å and no more than 200 Å, since the number of layers (number of pairs of a well layer and a barrier layer) is increased. In addition, when the film thickness of a well layer is in this preferable range, a high reliability of the device and a long lifetime can be gained for light emission and oscillation with a large amount of current and with a high power output while, in a laser device, a continuous oscillation at 80 mW becomes possible and an excellent device lifetime can be implemented in a broad output range such as from 5 mW to 80 mW. At this time, it is necessary to adopt the above range of film thickness of a well layer for at least one well layer in the case that the active layer has a multiple quantum well structure and preferably the above film thicknesses are adopted for all of the well layers. By doing so, the above described effects are gained in each of the well layers so that a light emitting recombination and a photoelectric conversion efficiency are further improved. By using a nitride semiconductor that includes In, more preferably InGaN, for a well layer, an excellent device lifetime can be gained. At this time, by making the composition ratio x of In in the range of $0 < x \le 0.3$, a well layer of a thick film with a good crystal can be formed and preferably by making $x \le 0.2$, a plurality of well layers of thick films with a good crystal structure can be formed so that an active layer in a good MQW structure can be gained.

(10) The above described first barrier layer preferably has a p-type impurity. In this structure, the above described injection of carriers from the p-type layer becomes effective and the lifetime of the carriers tends to increase and, as a result, the structure contributes to increases in the reverse withstanding voltage, the device lifetime and the output. This is because, as described above, a carrier injection from the p-type layer becomes excellent due to substantially no inclusion of an n-type impurity and, furthermore, it becomes possible to accelerate further injection of carriers into the active layer by having a p-type impurity in the first barrier layer so that a large amount of carriers are effectively injected from the p-type layer into the active layer or deep inside the active layer (n-type layer side) and, thereby, increases in light emitting recombination, photoelectric conversion efficiency and device lifetime and, in addition, an improvement in the characteristic of reverse withstanding can be implemented.

(11) In addition, though the concentration of the p-type impurity in the first barrier layer is not in particular limited, it is preferable to be no less than $1 \times 10^{16}$ cm$^{-3}$ and no more than $1 \times 10^{19}$ cm$^{-3}$. In the case the p-type impurity concentration is too low, the hole injection efficiency into the well layer is lowered, while if it is too high, the carrier mobility in the first barrier layer is lowered so as to increase the Vf value of the laser.

(12) The first barrier layer of which the p-type impurity concentration is in such a range is an i-type or a p-type.

(13) The doping of a p-type impurity into the first barrier layer is preferably carried out through diffusion from the p-type nitride semiconductor layer after making the undoped first barrier layer grow rather than being carried out at the time of the growth of the first barrier layer. This is because, in the case that it is carried out at the time of the growth of the first barrier layer, a p-type impurity diffuses into an n-type well layer beneath the first barrier layer at the time when the first barrier layer grows so that the device lifetime characteristics is lowered, on the other hand, in the case that the doping of a p-type impurity is carried out through diffusion, a p-type impurity can be doped into the first barrier layer without affecting the well layer.

(14) In the case that an n-type nitride semiconductor layer, an active layer and a p-type nitride semiconductor layer are layered in sequence in the device structure, the barrier layer can have a p-type impurity because a p-type impurity diffuses from the p-type nitride semiconductor layer that is made to grow subsequent to the first barrier layer, which is made to grow without doping.

(15) A nitride semiconductor device of the present invention preferably has a laser device structure wherein said p-type nitride semiconductor layer has an upper clad layer made of a nitride semiconductor that includes Al of which the average mixed crystal ratio of x, wherein $0 < x \leq 0.05$ and wherein said n type nitride semiconductor layer has a lower clad layer made of a nitride semiconductor that includes Al of which the average mixed crystal ratio of x, wherein $0 < x \leq 0.05$. A laser device gained in such a structure can continuously oscillate with the output of 5 mW to 100 mW so as to become an LD having device characteristics suitable for a reading and writing light source in an optical disk system and makes it possible to implement a long lifetime. By limiting the average mixed crystal ratio of Al in the clad layer to 0.05, or less, an optical wave guide which makes it possible to control a self-exciting oscillation at the time of a high power output is provided so that a continuous oscillation with a high power output in a stable manner becomes possible and it also becomes possible to gain an LD for an optical disk light source. Though, conventionally, a nitride semiconductor of which the average composition of Al in the clad layer is no less than 0.05 and no more than 0.3 is used, in this structure confinement of light becomes too strong and, thereby, a self-exciting oscillation is generated in a continuous oscillation with a high output of 30 mW, or more. This self-exciting oscillation is due to the generation of a kink in the current-light output characteristics that is generated on the low output side in an LD structure which has a strong light confinement in the longitudinal direction so as to enhance the light density and such generation of a kink thus becomes disadvantageous as a light source of an optical disk system so that a self-exciting oscillation due to the kink is unstable and leads to dispersion in the devices. According to the structure of the present invention, an optical wave guide, of which the refraction difference in a clad layer is reduced, is gained and by using an active layer that is in the above described range, a large amount of carriers are continuously injected in a stable manner for light emitting recombination in the structure so that a continuous oscillation can be gained so as to exceed the compensation for the loss due to the lowering of the light confinement in the clad layer and, moreover, the light emission efficiency within the active layer can be enhanced.

It is preferable that said upper clad layer has a p-type conductivity and said lower clad layer has an n-type conductivity, and that said active layer has a first barrier layer that is arranged in a position nearest to said upper clad layer as said barrier layer and a second barrier layer that is different from the first barrier layer and, at the same time, it is preferable that said first barrier layer has a p-type impurity and said second barrier layer has an n-type impurity. In such a structure, as described above, injection of carriers from the p-type layer is carried out in an excellent condition and, as a result, device characteristics, in particular device lifetime, are improved.

(16) The above p-type nitride semiconductor layer preferably contains a first p-type nitride semiconductor layer so as to adjoin the active layer so that the first p-type nitride semiconductor layer is made of a nitride semiconductor that includes Al. In this structure, as shown in FIGS. 4 to 7, the first p-type nitride semiconductor layer 28 functions as an electron confining layer and, in particular, makes it possible to confine a large amount of carriers within the active layer in an LD and an LE with a large current drive for high power output. In addition, in the relationships between the above first barrier layer, barrier layer BL and the first p side barrier layer, as shown in FIG. 8, the film thicknesses of these barrier layers determine the distance dB between the first p-type nitride semiconductor layer and a well layer 1b so as to greatly affect the device characteristics.

In addition, since the first p-type nitride semiconductor layer may grow in the form of a thin film, it can be made to grow at a temperature lower than that for a p-type clad layer. Accordingly, by forming a p-type electron confining layer, resolution of an active layer that includes In can be prevented as opposed to the case where a p-type clad layer is directly formed on the active layer. That is to say, the p-type electron confining layer plays the roles of preventing the resolution of the active that includes In in the same manner as does the barrier layer of FIG. 1.

(17) The above described first p-type nitride semiconductor layer is provided so as to contact the barrier layer nearest to the above described p-type nitride semiconductor layer, and, preferably, is formed of a semiconductor which has been grown by being doped with a p-type impurity of which the concentration is higher than that in a barrier layer in the above active layer. Because of this structure, the injection of carriers from the p-type layer to the barrier layer (the above described first barrier layer) closest to the p-type layer becomes easy to implement. In addition, by doping a p-type impurity of a high concentration into the first p-type nitride oxide layer, a p-type impurity is diffused into the barrier layer so that an appropriate p-type impurity can be added. Thus, since it becomes unnecessary to add an impurity at the time of barrier layer growth, it becomes possible to make a barrier layer grow with a good crystal structure. In particular, in the case that this barrier layer is a nitride semiconductor that includes In, crystal deterioration is great due to impurity addition and the effect thereof is significant. In addition, in the case that the first p-type nitride semiconductor layer is, as described below, a nitride semiconductor that includes Al and the Al mixed crystal ratio thereof is higher than the mixed crystal ratio of Al in the p-type clad layer, it effectively functions as an electron confining layer which confines electrons within the active layer and the effects are gained wherein an oscillation threshold value and driving current are lowered in a large current drive, a high power LD and an LED.

(18) It is preferable for the number of well layers to be in the range of from no less than 1 to no more than 3 in the above described active layers. In this structure it becomes possible to lower the oscillation threshold value in comparison with the case where the number of threshold layers is 4, or more. In addition, at this time by making the film thickness of the well layer 40 Å, or more, as described above, a broad space is secured inside of a small number of well layers so that an effective light emitting recombination becomes possible even in the case that a large amount of carriers are injected so that this makes an increase in the device lifetime and an increase in the light emission output possible. In particular, in the case that the film thickness of the well layer is 40 Å, or less, and the number of well layers is 4, or more, a large amount of carriers are injected into each well layer of a thin film, in comparison with the above described case, in order to gain a high power LD or LED by driving the well layers with a large current so that the well layers are driven under severe conditions and device deterioration occurs at an early stage. In addition, when the number of well layers increases, the carriers are not distributed uniformly but, rather, tend to be distributed unevenly so that the above described device deterioration becomes a critical problem in the case wherein the device is driven with a large amount of current under such a condition. In such a structure as described above, the barrier layer that is nearest to the p-type layer side does not include an n-type impurity or have a p-type impurity, or other barrier layers each do have an n-type impurity and, thereby, a large amount of carriers can be injected into the well layers in a stable manner and, in addition, the well layer is maintained at the above described film thickness (40 Å, or more) so that these closely relate to each other to appropriately work to implement an excellent device lifetime and a high light emission output in a consecutive driving of the device.

(19) It is preferable that the above described second barrier layer is arranged so as to be sandwiched by well layers and the film thickness ratio Rt of the above described well layer to the second barrier layer is in the range of from 0.5≤Rt≤3. Because of this structure a light emitting device and a laser device can be gained wherein the response characteristics are excellent and RIN is low in order to be used specifically for an optical disk system, an optical communication system, and the like. That is to say, though the film thicknesses of the well layers, the barrier layers and the active layers become factors that greatly affect the RIN and the response characteristics in the active layer of a quantum well structure, a light emitting device and a laser device that are excellent in these characteristics can be gained by limiting the film thickness ratio of the well layer to the barrier layer to the above described range in this structure.

(20) It is preferable for the film thickness dw of the above described well layer to be in the range of 40 Å≤dw≤100 Å and for the film thickness db of the above described second barrier layer to be in the range of db≥40 Å. In this structure, by adjusting the film thickness of the well layer so that the above described film thickness ratio Rt is in the above described range, a laser device having a long lifetime, a high power output, as shown in FIG. 12, and having RIN characteristics as well as response characteristics that are suitable for the light source of an optical disk system. That is to say, in the light emitting device of the present invention the lifetime can be made longer by increasing the film thickness of the well layer while, on the other hand, the response characteristics and the RIN characteristics tend to be lowered when the film thickness of the well layer is increased. In this structure, this is appropriately improved. In addition, in the case that the film thickness of the barrier layer is 40 Å, or more, an excellent device lifetime can be gained so that a laser device that becomes an excellent light source in an optical disk system can be gained as shown in FIG. 13.

(21) It is preferable for the above described p-type nitride semiconductor layer and the above described n-type nitride semiconductor layer to have, respectively, an upper clad layer and a lower clad layer so that the average mixed crystal ratio of Al in the nitride semiconductor of the upper clad layers become greater than that in the lower clad layers. This is because, in an effective refraction type laser device, confinement in the lateral direction can be reduced by increasing the mixed crystal ratio of Al in the upper clad layer, wherein an effective refraction difference is created, so as to have an upper clad layer of which the refraction is small. That is to say, by reducing the refraction difference between a buried layer, which creates an effective refraction difference on both sides of the wave guide, and the upper clad layer, the structure can be gained wherein the confinement in the lateral direction is made smaller. Thus, the confinement in the lateral direction is reduced and light density is reduced and, thereby, a laser device can be gained wherein, up to a high output range, no kink is generated.

(22) Furthermore, the average mixed crystal ratio x of Al in the above described upper clad layer is in the range of 0<x≤0.1 and, thereby, a laser device can be gained which has the laser characteristics, in particular, characteristics such as current-light output characteristics, that can be used appropriately for an optical disk system. At this time the oscillation wavelength of the laser device can be adjusted in the range of from no less than 380 nm to no more than 420 nm so that an appropriate laser device can be gained by using the above described clad layer.

(23) The above described p-type nitride semiconductor layer has a first p-type nitride semiconductor layer that contacts the above described active layer and becomes an electron confining layer and the active layer has a well layer of which the distance dB from the first p-type nitride semiconductor layer is in the range of from no less than 100 Å to no more than 400 Å and has a first barrier layer within the distance dB and, thereby, a nitride semiconductor device of which the device lifetime is excellent can be gained. This can be made to be a device structure wherein, as shown in FIG. 8, the distance dB from the first p-type nitride semiconductor layer 28 has a first barrier layer, that is to say, a barrier layer that does not substantially have an n-type impurity or that is adjusted to have a p-type impurity and, thereby, device deterioration due to the first p-type nitride semiconductor layer, which is a p-type carrier confining layer, is prevented so as to improve the device lifetime and it becomes possible to accelerate a light emitting recombination in a well layer arranged outside of the distance dB. Here, the device has, at least, the above described first barrier layer in the region of the distance dB, that is to say, the device has an impurity adjusted region, wherein, as described above, an impurity, or the amount of the impurity, is adjusted in at least a portion thereof in the region of the distance dB. At this time, the distance dB is preferably the first barrier layer, that is to say, a first barrier layer of which the film thickness is dB is preferably formed so as to contact the first p-type nitride semiconductor layer so that the above described effects can be maximally gained. In this manner, by using the region of the distance dB as an impurity adjusted region, as shown in FIG. 8B, a structure can be gained wherein a plurality of layers of different band gap energies are provided. For example, in FIG. 8B a region 4, of which the band gap energy is smaller than that of the barrier layer 2c, is formed wherein the above described effects can be gained by making the region dB an impurity adjusted region. Contrarily, in a similar manner, a layer 4, which has band gap energy larger than that of the barrier layer 2b, may be provided. That is to say, in the case that a plurality of layers of which the band gap energies are different are provided in the region dB, a device of which the characteristics are excellent can be gained by adjusting the impurity, or the amount of the impurity, in the region dB which is used as the first barrier layer. Furthermore, the distance dB is preferably in the range of from no less than 120 Å to no more than 200 Å so that a nitride semiconductor device with an appropriate active layer in the device structure can be gained.

As the n-type impurity used in the nitride semiconductor device of the present invention, group IV or VI elements such as Si, Ge, Sn, S, O, Ti and Zr may be used, while Si, Ge or Sn is preferable and most preferably Si is used. As the p-type impurity, Be, Zn, Mn, Cr, Mg, Ca or the like may be used, and Mg is preferably used.

For the purpose of the present invention, the term undoped means a nitride semiconductor grown without adding p-type impurity or n-type impurity as a dopant, for example organometallic vapor phase growing process in a reaction vessel without supplying any impurity which would serve as dopant.

BRIEF DESCRIPTION OF THE DRAWINGS

FIGS. 9A and 9B is a schematic sectional view of a device according to one embodiment of the present invention.

DETAILED DESCRIPTION OF THE PREFERRED EMBODIMENTS

The nitride semiconductor used in the nitride semiconductor device of the present invention may be GaN, AlN or InN, or a mixed crystal thereof, namely gallium nitride compound semiconductor ($In_xAl_yGa_{1-x-y}N$, $0 \leq x$, $0 \leq y$, $x+y \leq 1$). Mixed crystals made by using B as the group III element or by partially replacing N of the group V element with P or As may also be used.

(Active Layer)

The active layer of the present invention has quantum well structure which may be either multiple quantum well structure or single quantum well structure, but preferably multiple quantum well structure which makes it possible to increase the output power and decrease the threshold of oscillation. The quantum well structure of the active layer may be constituted from well layers and barrier layers to be described later being stacked one on another. This structure of stacked layers is such that the well layer is sandwiched by the barrier layers. In the case of single quantum well structure, at least one barrier layer is provided each on the p-type nitride semiconductor layer side and on the n-type nitride semiconductor layer side so as to sandwich the well layer. In the case of multiple quantum well structure, the active layer comprising a plurality of well layers and barrier layers stacked one on another is constituted as described later in preferred embodiments.

The active layer has preferably such a structure as barrier layers are provided as layers located at positions nearest to the n-type nitride semiconductor layer and the p-type nitride semiconductor layer (hereinafter referred to as outermost layer). The outermost layers located on both sides are preferably barrier layers.

Figure 10:
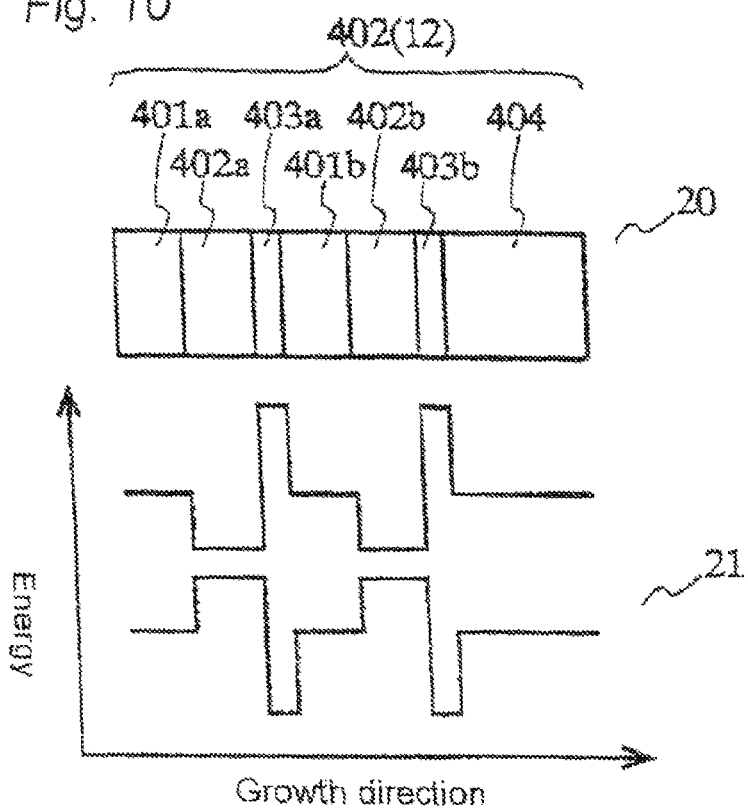
FIG. 10 is a schematic sectional view of stacked structure and schematic diagram showing band structure according to one embodiment of the present invention.

In the multiple quantum well structure, the barrier layer sandwiched between the well layers is not limited to a single layer (well layer/barrier layer/well layer), and two or more barrier layers of different compositions and/or impurity concentrations may be stacked such as well layer/barrier layer (1)/barrier layer (2) . . . /well layer. For example, such a structure may also be employed as an upper barrier layer 403 made of a nitride semiconductor including Al and a lower barrier layer 401 having an energy band gap smaller than that of the upper barrier layer are provided between the well layers 402, as shown in FIG. 10.

(Well Layer)

The well layer of the present invention is preferably made of a nitride semiconductor including In, having a composition of ($In_\alpha Ga_{1-\alpha}N$ $0<\alpha \leq 1$). This constitution makes the well layer capable of oscillating and emitting light satisfactorily. Wavelength of the emitted light can be determined by controlling the proportion of In. In addition to InGaN, the nitride semiconductors described above such as InAlGaN and InN may be used and nitride semiconductors which do not include In may also be used in the present invention, but a nitride semiconductors which includes In as higher efficiency of light emission and is more preferable.

Thickness and number of the well layers may be determined as required except for the case to be described later in the fifth embodiment. Specifically, thickness of the well layer is in a range from 10 Å to 300 Å, and preferably in a range from 20 Å to 200 Å, which allows it to decrease Vf and the threshold current density. When the crystal growth is taken into consideration, a layer of relatively homogeneous quality without significant variations in the thickness can be obtained when the thickness is 20 Å or greater, and the crystal can be grown while minimizing the generation of crystal defects by limiting the thickness within 200 Å. There is no limitation on the number of the well layers provided in the active layer, which may be 1 or more. When four or more well layers with larger thickness of layers constituting the active layer, total thickness of the active layers becomes too large and the value of Vf increases. Therefore, it is desirable to restrict the thickness of the well layer within 100 Å thereby to restrain the thickness of the active layer.

The well layer may be doped or undoped with n-type impurity. When a nitride semiconductor which includes In is used as the well layer, however, an increase in the concentration of n-type impurity leads to lower crystallinity and therefore it is preferable to restrict the concentration of the n-type impurity thereby to make the well layer of good crystallinity. Specifically, in order to achieve best crystallinity, the well layer is preferably grown without doping, with the n-type impurity concentration being kept within $5 \times 10^{16}/cm^3$. When the well layer is doped with n-type impurity, controlling the n-type impurity concentration within a range from $1 \times 10^{18}/cm^3$ to $5 \times 10^{16}/cm^3$ makes it possible to suppress the degradation of crystallinity and increase the carrier concentration, thereby decreasing the threshold current density and the value of Vf. At this time, it is preferable to keep the n-type impurity concentration in the well layers nearly equal to or less than the n-type impurity concentration in the barrier layer, which will accelerate the light emission recombination in the well layer and increase the light emission output power. Thus the well layers doped with the n-type impurity are preferably used in a low output device such as LD or LED having output power of 5 mW, having effects of decreasing the value of Vf and the threshold current density. In order to keep the n-type impurity concentration in the well layers nearly equal to or less than that of the barrier layer, the well layer may be doped with larger amount of n-type impurity than that for the barrier layer when growing, or modified doping may be employed wherein the barrier layer is grown while being doped and the well layers are grown without doping. At this time, the well layers and the barrier layers may be grown without doping thereby to constitute a part of the active layer.

In a device driven with a large current (such as LD or LED of high output power), recombination of the carriers in the well layers is accelerated and light emission recombination occurs at a higher probability when the well layers are undoped and do not substantially include n-type impurity. When the well layers are doped with the n-type impurity, in contrast, carrier concentration in the well layers increases resulting in lower probability of the light emission recombination which leads to a vicious cycle of the drive current increasing with a constant output power, and consequently causing the device reliability (lifetime of the device) to decrease significantly. For this reason, in a high power device (such as LD or LED of output power in a range from 5 to 100 mW), the n-type impurity concentration in the well layers is kept not higher than $1 \times 10^{18}/cm^3$, and preferably the well layers are grown without doping or with such a concentration that can be regarded as including substantially no n-type impurity, which makes it possible to achieve a nitride semiconductor device capable of stable operation with high output power. In a laser device with the well layer being doped with n-type impurity, spectrum width of the peak of the laser beam tends to spread and therefore the n-type impurity concentration is kept within $1 \times 10^{18}/cm^3$, and preferably $1 \times 10^{17}/cm^3$. Doping n-type impurity in the well layer also degrades the crystallinity of the well layer. If a device with the low-crystallinity well layer is operated with so high current density as likely in a laser device, the well and device is degraded and the life of the device is shorten.

(Barrier Layer)

According to the present invention, there is no limitation to the composition of the barrier layer, and a nitride semiconductor including In with the proportion of In being lower than that of the well layer, or a nitride semiconductor including GaN or Al may be used. Specific composition may be $In_\beta Al_\gamma Ga_{1-\beta-\gamma}N$ ($0 \leq \beta < 1$, $0 \leq \gamma \leq 1$), $In_\beta Ga_{1-\beta}N$ ($0 \leq \beta < 1$, $\alpha > \beta$), GaN or $Al_\gamma Ga_{1-\gamma}N$ ($0 < \gamma \leq 1$). In the case of a barrier layer (lower barrier layer) which serves as the base layer in contact with the well layer, a nitride semiconductor which does not include Al is preferably used. Specifically, $In_\beta Ga_{1-\beta}N$ ($0 \leq \beta < 1$, $\alpha > \beta$) or GaN is preferably used. This is because growing a well layer made of a nitride semiconductor which includes In directly on a nitride semiconductor which includes Al such as AlGaN leads to lower crystallinity, eventually resulting in impeded function of the well layer. Also it is intended to make the band gap energy of the barrier layer higher than that of the well layer. Best combination of the compositions of the well layers and the barrier layers may be selected from the compositions described above, by giving consideration to the fact that the barrier layer serves also as the base layer which determines the crystallinity of the well layer.

The barrier layer may be doped or undoped with the n-type impurity, except for the barrier layer located nearest to the p-type layer to be described later, but preferably doped with the n-type impurity. When doped, the n-type impurity concentration in the barrier layer is preferably $5 \times 10^{16}/cm^3$ or higher and lower than $1 \times 10^{20}/cm^3$. In the case of LED which is not required to have a high output power, for example, the n-type impurity concentration is preferably in a range from $5 \times 10^{16}/cm^3$ to $2 \times 10^{18}/cm^3$. For LED of higher output power and LD, it is preferable to dope in a range from $5 \times 10^{17}/cm^3$ to $1 \times 10^{20}/cm^3$ and more preferably in a range from $1 \times 10^{18}/cm^3$ to $5 \times 10^{19}/cm^3$. When doping to such a high concentration, it is preferable to grow the well layer without doping or with substantially no n-type impurity included. The reason for the n-type impurity concentration being different among the regular LED, the high-power LED and the high-power LD (output power in a range from 5 to 100 mW) is that a device of high output power requires higher carrier concentration in order to drive with larger current for higher output power. Doping in the range described above, as described above, it is made possible to inject the carrier to a high concentration with good crystallinity. In the case of a nitride semiconductor device such as lower-power LD, LED or the like, in contrast, a part of the barrier layer of the active layer may be doped with the n-type impurity or the entire barrier layers may be formed with substantially no n-type impurity included. When doping with the n-type impurity, all the barrier layers of the active layer may be doped or a part of the barrier layers may be doped.

While there is no limitation to the thickness of the barrier layer, the thickness is preferably not larger than 500 Å, and more specifically from 10 to 300 Å similarly to the well layer.

Figure 14:
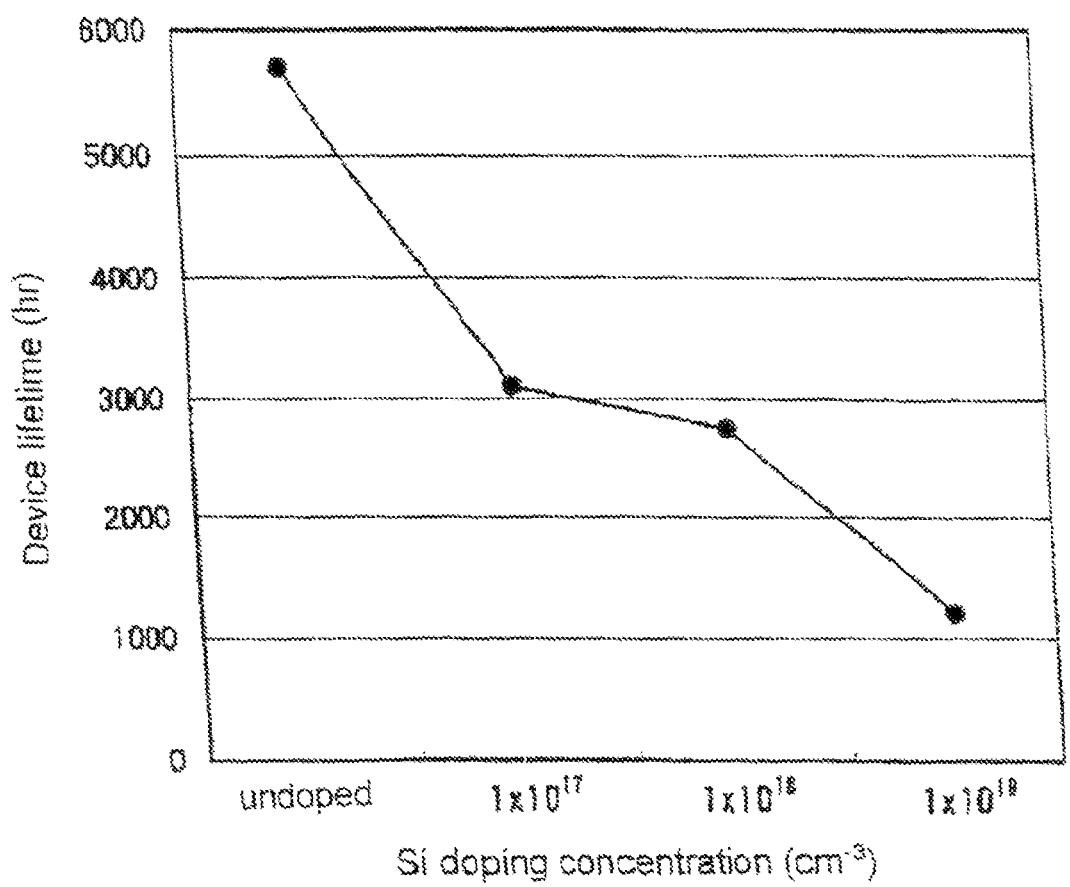
FIG. 14 is a diagram showing the relationship between the device lifetime and doping concentration in one embodiment of the present invention.
Figure 15:
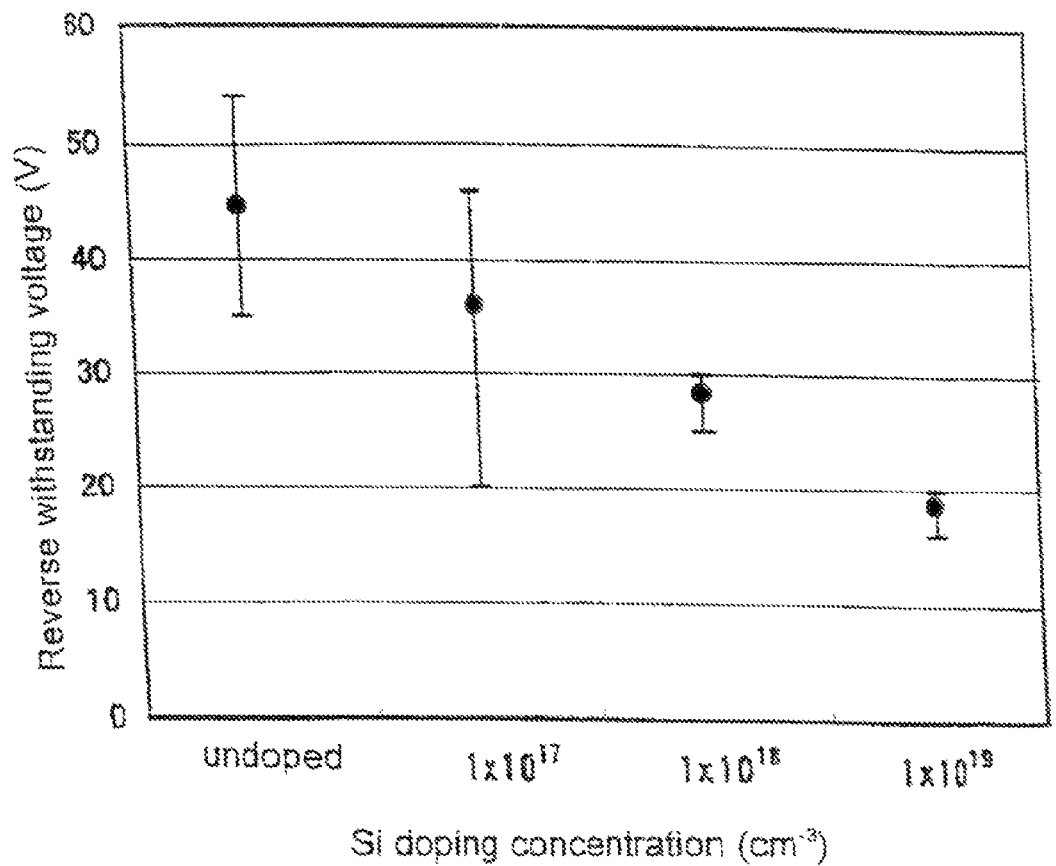
FIG. 15 is a diagram showing the relationship between the reverse withstanding voltage and doping concentration in one embodiment of the present invention.

In the embodiments to be described later, barrier layers doped with p-type impurity are used. The p-type impurity concentration is in a range from $5 \times 10^{16}/cm^3$ to $1 \times 10^{20}/cm^3$, and preferably in a range from $5 \times 10^{16}/cm^3$ to $1 \times 10^{18}/cm^3$. This is because p-type impurity concentration higher than $1×10^{20}/cm^3$ does not cause substantial difference in the carrier concentration while causing deterioration of the crystallinity due to inclusion of the impurity and an increase in the loss due to light scattered by the impurity, thus resulting in lower efficiency of light emission in the active layer. When impurity concentration is within $1×10^{18}/cm^3$, the lowering of efficiency of light emission due to increasing impurity can be suppressed and high carrier concentration from the p-type layer into the active layer can be kept stable. In addition, a trace of p-type impurity is preferably included as the lower limit of the p-type impurity concentration. This is because a low p-type impurity concentration causes the p-type impurity to function as a carrier with a higher probability than in the case of high concentration. At this time, the barrier layer which includes the p-type impurity preferably includes substantially no n-type impurity, in the embodiments described later. This is because the barrier layer which includes the p-type impurity having substantially no n-type impurity included therein functions as a barrier layer that accelerates the injection of the carrier from the p-type layer, while the presence of the p-type impurity enhances the action. FIG. 14 and FIG. 15 show the lifetime of the device and the reverse withstanding voltage, respectively, as the functions of the n-type impurity concentration in the barrier layer located nearest to the p-type layer. As will be apparent from these graphs, lifetime of the device and the reverse withstanding voltage decrease sharply as the n-type impurity concentration increases, resulting in deterioration in the device characteristics. Thus in the nitride semiconductor device of the present invention, the barrier layers (the first barrier layer, the barrier layer $B_L$ and the first p-type barrier layer) which are nearest to the p-type layer are preferably grown without doping with the n-type impurity or not doping substantially with the n-type impurity, more preferably include p-type impurity, and most preferably include p-type impurity without including n-type impurity. This is because the absence of n-type impurity makes the injection of the carrier from the p-type layer efficient, while the presence of the p-type impurity accelerates the injection of the carrier, and the combination of these conditions, namely including p-type impurity without including n-type impurity, makes it possible to inject a large amount of carrier efficiently from the p-type layer.

(Doping with n-Type Impurity)

According to the present invention, the active layer comprises well layers which include n-type impurity $5×10^{16}/cm^3$ in concentration or higher and barrier layers, and preferably one or more of the well layers and/or barrier layers in the active layer is undoped or does not substantially include n-type impurity. This results in the active layer which as whole contains n-type impurity while the well layers and/or barrier layers which constitute a part of the active layer are doped with the n-type impurity, thus achieving an efficient distribution of carrier concentration for the active layer.

For the purpose of the present invention, the term undoped means a nitride semiconductor grown without intentionally doping with n-type or p-type impurity. At this time, impurity concentration becomes less than $5×10^{16}/cm^3$. In the present invention, not substantially including n-type impurity or p-type impurity means that the impurity concentration is less than $5×10^{16}/cm^3$.

Described above are the explanations of the active layer, the barrier layers and the well layers not detailed in the preferred embodiments that follow, and will be complemented by the description of the embodiments.

Embodiment 1

Figure 2:
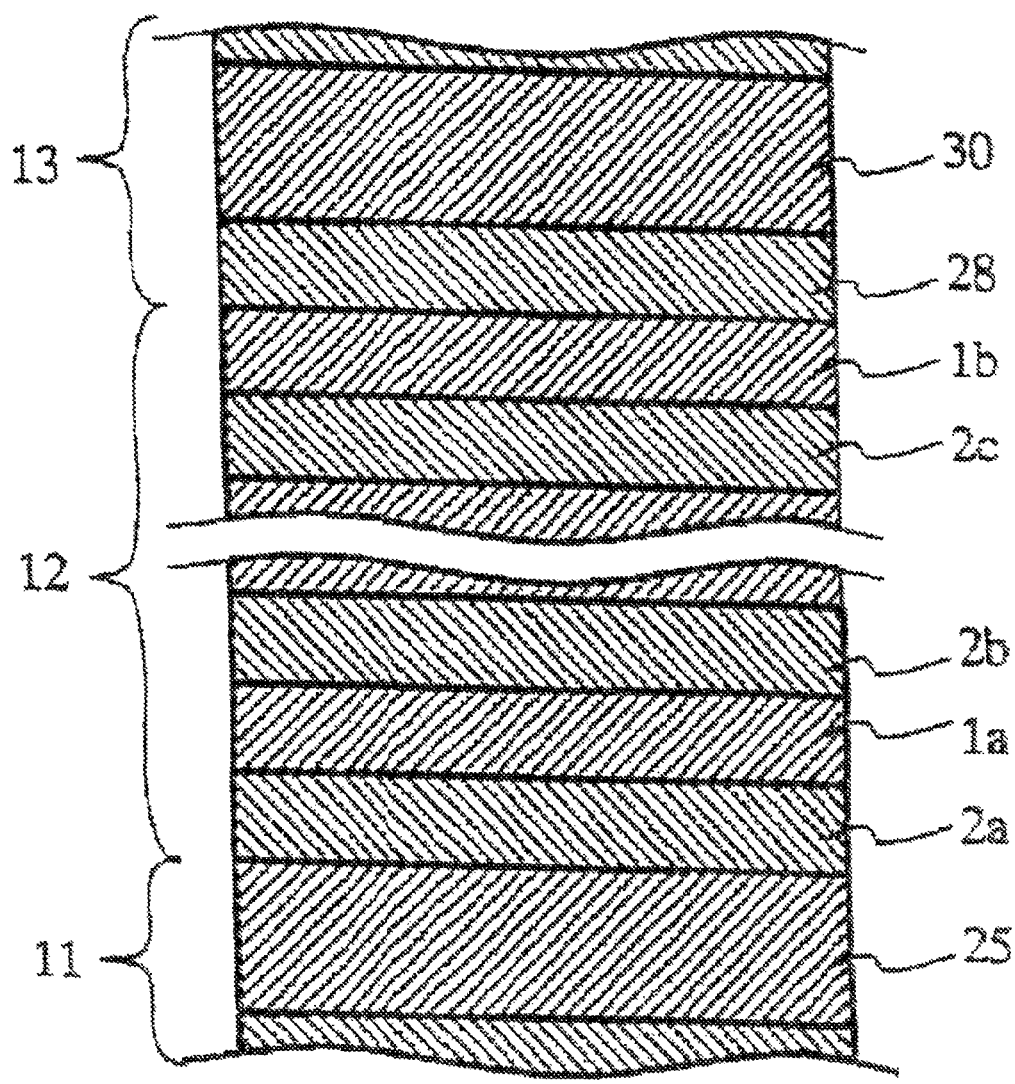
FIG. 2 is a schematic sectional view showing one embodiment of the present invention.
Figure 3:
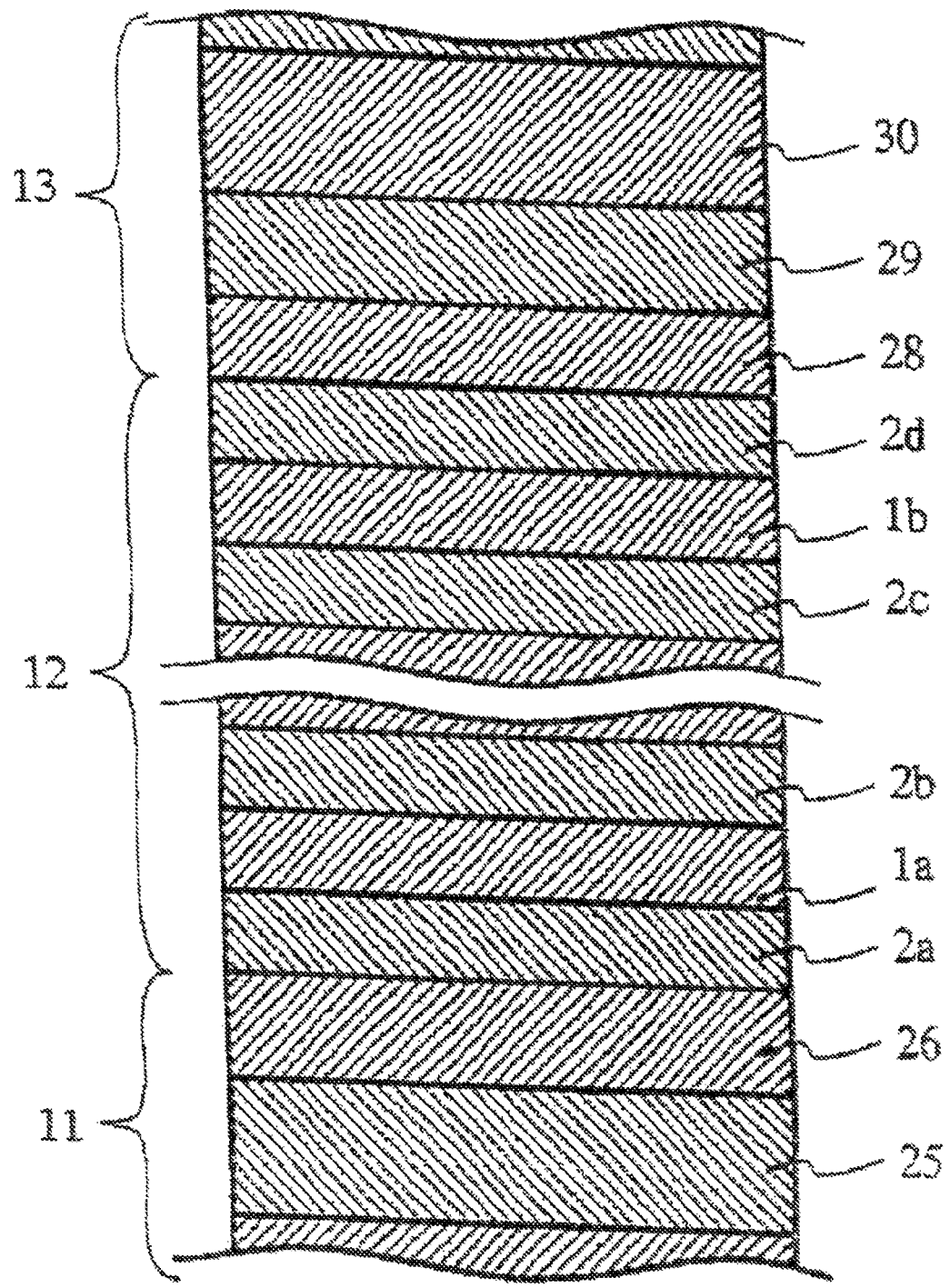
FIG. 3 is a schematic sectional view showing one embodiment of the present invention.

The first embodiment of the nitride semiconductor device according to the present invention comprises, as shown in FIG. 2 and FIG. 3, an active layer 12 sandwiched by a p-type nitride semiconductor layer 13 and an n-type nitride semiconductor layer 11, with the active layer including therein a first barrier layer located at a position nearest to the p-type nitride semiconductor layer and a second barrier layer which includes n-type impurity. The first barrier layer is undoped with the n-type impurity, or has been grown without doping so that substantially no n-type impurity is included therein. For the first barrier layer, either the layer nearest to the p-type nitride semiconductor layer in the active layer (hereinafter referred to as the layer nearest to the p side) may be a well layer 1b as shown in FIG. 2, or this layer may be first barrier layer as shown in FIG. 3. Preferably, as shown in FIG. 3, when the layer nearest to the p side in the active layer is used the first barrier layer, the first barrier layer can be provided in the active layer in contact with the p-type nitride semiconductor layer, so that the p-type nitride semiconductor layer 13, the first barrier layer 2d in the active layer 12 and the continuous p-type layer can be formed into the active layer as shown in FIG. 3. This makes it possible to efficiently inject the carrier from the p-type layer into the active layer, thereby decreasing the loss in driving the device and improving the device characteristics, particularly the reverse withstanding voltage and the device lifetime. In the case shown in FIG. 3, in contrast, since the well layer 1b is interposed between the p-type nitride semiconductor layer 13 and the first barrier layer 2c, continuous p-type layer may not be formed. However, since the first barrier layer 2c is the layer nearest to the p side in the active layer, an effect not conspicuous as but similar to that of the former case (the case of FIG. 3) is obtained thus making efficient injection of the carrier possible, although the effect is somewhat lower than that of the former case (the case of FIG. 3). At this time, the well layer preferably undoped as described above and, when the n-type impurity is included, the concentration thereof is preferably lower than that in the barrier layer.

On the other hand, in case the barrier layer which contains the p-type impurity (hereinafter referred to as p-type barrier layer) is the barrier layer not located at the position nearest to the p side in the active layer, making the barrier layer 2c a p-type barrier layer in FIG. 3, for example, results in deteriorated device characteristics. This is because the diffusion path length of the p-type carrier (hole) is significantly shorter than that of the n-type so that no substantial contribution is achieved to the improvement in the efficiency of carrier injection into the active layer, while injection of the n-type carrier is impeded leading to greater loss. This problem is most conspicuous when the barrier layer not located at the position nearest to the p side includes the p-type impurity.

The second barrier layer may be provided on the n-type nitride semiconductor layer side (hereinafter referred to as n side) adjacent to the first barrier layer, but is preferably provided via at least one well layer as shown in FIG. 2, FIG. 3. In this constitution, since the active layer has such a structure that comprises the first barrier layer which includes the p-type impurity is located nearest to the p side via one or more well layer, and the second barrier layer which includes the n-type impurity, injection of carrier into one or more well layer being sandwiched can be made more efficiently than in the case of adjacent arrangement without interposing the well layer. Therefore, it is preferable that the barrier layer nearest to the n side, namely the barrier layer 2a in FIGS. 2, 3, is at least the second barrier layer, that is, the first barrier layer and the second barrier layer are the outermost barrier layers of the active layer and located on the p side and on the n side, respectively. Moreover, the second barrier layer may be provided by single, or may be all the barrier layers except for the first barrier layer. Accordingly, in the first embodiment, the barrier layer nearest to the p side is the first barrier layer and the barrier layer nearest to the n side is the second barrier layer and more preferably, in addition to the constitution described above, all the barrier layers except for the barrier layer nearest to the p side are the second barrier layer. This constitution makes it possible to inject a large amount of carriers efficiently under high output operation of the device, resulting in improved reliability of the device under high output power operation. At this time, in addition to the constitution of the barrier layer nearest to the p side being the first barrier layer and the barrier layer nearest to the n side being the second barrier layer, such a constitution may also be possible as the barrier layer second nearest to the p side or the second nearest to the p side and the subsequent barrier layers are used as the p-type barrier layers. In the constitution of the first barrier layer $2d$, the p-type barrier layer $2c$ and the second barrier layer $2a$ in FIG. 3, difference in the diffusion path length of the carrier impedes the improvement in the efficiency of carrier injection and recombination, leading to greater loss.

The first barrier layer of the first embodiment of the present invention will be described in more detail below. It is an important factor in achieving the effect described above that the first barrier layer does not substantially include the n-type impurity as well as to include the p-type impurity. That is, similar effect can be achieved by not including the n-type impurity as that achieved by including the p-type impurity. This is because, since the first barrier layer does not include the n-type impurity, it is made possible to inject a large amount of the carrier efficiently from the p-type layer into the active layer or into the well layer nearest to the p side in the vicinity of the interface between the p-type layer or in the vicinity of the first barrier layer in the active layer, thereby improving the device characteristics similarly to the case described above. Conversely, making the first barrier layer virtually void of the n-type impurity leads to the improvement in the device characteristics. Preferably, having the p-type impurity included without substantially including the n-type impurity makes the effect described above remarkable. The second barrier layer is preferably grown without doping with the p-type impurity, or grown so as not to substantially include p-type impurity.

In the first embodiment of the present invention, lifetime of the device can be increased by making the thickness of the first barrier layer larger than the thickness of the second barrier layer. This is because as a sufficient space is secured as the first barrier layer where much p-type impurities exist during high output operation in addition to the relation with the first p-type nitride semiconductor layer to be described later, stable injection of carriers and recombination are ensured even with high output power. Conversely, the fact that the second barrier layer is thinner than the first barrier layer means that the distance of the well layer in the active layer from the n-type layer side is smaller, thereby accelerating the carrier injection from the n-type layer side to each well layer. At this time, by providing the second barrier layer by single, or setting all the barrier layers except for the first barrier layer as the second barrier layer, the distances of all the well layer from the n-type layer side can be made smaller, thereby making the carrier injection from the n-type layer side efficient.

Embodiment 2

The active layer has L (L≥2) barrier layers and, with a barrier layer located at a position nearest to the n-type nitride semiconductor layer denoted as $B_1$ and a barrier layer which is the ith (i=1, 2, 3, . . . , L) layer from said barrier layer $B_1$ to said p-type nitride semiconductor layer side denoted as barrier layer $B_i$, the barrier layers $B_i$ of i=1 to i=n (1<n<L) have n-type impurity, while barrier layer $B_L$ of i=L does not substantially include n-type impurity. The barrier layer $B_L$ corresponds to the first barrier layer of the first embodiment and is the barrier layer located nearest to the p side, while the action of the barrier layer $B_L$ is similar to that of the first embodiment. Therefore, the barrier layer $B_L$ in the second embodiment contains at least the p-type impurity and preferably does not substantially include the n-type impurity, so that the p-type carrier is injected selectively into the barrier layer $B_L$, thereby making the efficient injection of the carrier possible. Also because the barrier layers $B_i$ of i=1 to i=n include the n-type impurity so that n barrier layers are doped with the n-type impurity starting with the barrier layer nearest to the n-type layer thereby increasing the carrier concentration, the carrier is injected smoothly from the n-type layer into the active layer, resulting in accelerated injection and recombination of the carrier and improved device characteristics. At this time, the well layer may be either undoped or doped with the n-type impurity. Particularly when the device is driven with a large current (high output LD or LED), making the well layer undoped or not substantially including the n-type impurity accelerates the recombination of the carrier in the well layer so that the nitride semiconductor device of high device characteristics and high reliability can be obtained.

The number n in the second embodiment is required to satisfy at least the condition of 0<n<L, and preferably satisfy the condition of $n_m$<n<L and $n_m$=L/2 ($n_m$ is an integer with the fraction rounded off). This is because it is made possible to inject the carrier from the n-type layer deep into the active layer (to the p-type layer side) by having the n-type impurity included in half or more of the barrier layers in the active layer. This acts advantageously particularly in the case of a multi-quantum well structure wherein the number of the well layers in the active layer is 3 or more, or the number of layers stacked in the active layer is 7 or more. Specifically, in FIGS. 2, 3, the barrier layers $2a$, $3a$ are doped with the n-type impurity as the barrier layers $B_i$, the barrier layers $2c$ (FIG. 2) or the barrier layers $2d$ (FIG. 3) is doped with the p-type impurity as the barrier layers $B_L$, and other barrier layers sandwiched by the barrier layers $B_i$ and the barrier layers $B_L$ are undoped, thereby to constitute the active layer.

In the second embodiment, by making the barrier layer $B_L$ thicker than the barrier layer $B_i$ (i≠L), as described above, in a high output device which requires stable injection of carriers in a large amount into the well layer, since the barrier layer $B_L$ located at a position nearest to the p-type layer (near the entrance of injecting the carrier from the p-type layer) has a large space where the p-type carriers exist, the carriers of high concentration can be injected in a stable manner, so that reliability of the device such as lifetime is improved.

Embodiment 3

The active layer 107 has MQW structure wherein $In_{x1}Ga_{1-x1}N$ well layer (0<$x_1$<1) and $In_{x2}Ga_{1-x2}N$ barrier layer (0≤$x_2$<1, $x_1$>$x_2$) are stacked alternately a proper number of times in the order of barrier layer, well layer, barrier layer, with both ends of the active layer being the barrier layers. The well layers are grown undoped. On the other hand, all barrier layers except for the last barrier layer which adjoins the p-type electron confinement layer 108 are doped with an n-type impurity such as Si or Sn, while the first barrier layer is grown undoped. The last barrier layer includes a p-type impurity such as Mg which has diffused therein from the adjacent p-type nitride semiconductor layer.

As the barrier layers except for the first barrier layer are doped with the n-type impurity, the initial electron density in the active layer becomes higher and the efficiency of injecting electrons into the well layer is increased, thus resulting in improved efficiency of laser emission. The last barrier layer, on the other hand, is located nearest to the p-type layer and therefore does not contribute to the injection of electrons into the well layer. Therefore, the efficiency of injecting holes into the well layer can be improved by virtually doping through the diffusion of the p-type impurity from the p-type layer, without doping the first barrier layer with the n-type impurity. Also because the first barrier layer is not doped with the n-type impurity, such a problem can be eliminated that the carrier mobility decreases due to the coexistence of impurities of different types in the barrier layer.

An example of the active layer is described below. The active layer 107 is formed on the n-type nitride semiconductor layers 103 to 106. As described previously, the active layer 107 has the MQW structure wherein $In_{x1}Ga_{1-x1}N$ well layer ($0<x_1<1$) and $In_{x2}Ga_{1-x2}N$ barrier layer ($0 \leq x_2 <1$, $x_1 > x_2$) are stacked alternately a proper number of times, with both ends of the active layer being the barrier layers. The well layer is formed undoped. All barrier layers except for the first barrier layer are doped with an n-type impurity such as Si or Sn preferably in a concentration from $1 \times 10^{17}/cm^3$ to $1 \times 10^{19}/cm^3$.

The last barrier layer is grown undoped, and includes a p-type impurity such as Mg in a concentration from $1 \times 10^{16}/cm^3$ to $1 \times 10^{19}/cm^3$ through the diffusion from the p-type electron confinement layer 108 to be grown next. When growing the first barrier layer, it may also be grown while doping with p-type impurity such as Mg in a concentration not higher than $1 \times 10^{19}/cm^3$. The last barrier layer is formed to be thicker than the other barrier layers in order to suppress the effect of decomposition by gas etching when growing the p-type electron confinement layer 108. Thickness of the first barrier layer, is preferably 1.1 to 10 times the thickness of the other barrier layers, more preferably 1.1 to 5 times, although it depends on the conditions of growing the p-type electron confinement layer 108. With this constitution, the first barrier layer serves as the protective film which prevents the active layer that includes In from decomposing.

Embodiment 4

The fourth embodiment of the present invention has such a constitution as a first p side barrier layer disposed at a position nearest to the p-type nitride semiconductor layer and a second n side barrier layer which is disposed at a position near to the n-type nitride semiconductor layer are provided as the outermost layers in the active layer, and the first p side barrier layer includes p-type impurity while the second n side barrier layer includes n-type impurity. In this constitution, as shown in FIG. 3, the active layer is sandwiched by the first p side barrier layer 2a and the second n side barrier layer 2d and has the well layer 1 and the barrier layers 2b, 2c. Since the first p side barrier layer is provided as the layer disposed at a position nearest to the p side in the active layer, the carriers can be injected efficiently from the p-type layer, while injection of the carriers from the n-type layer can be made satisfactorily by providing the second n side barrier layer as the layer disposed at a position near to the n-type layer in the active layer. As a result, efficient injection of the carriers from the n side layer and the p side layer into the active layer and recombination thereof are made possible, thus achieving improvements in the reliability and lifetime of the device of high output power. At this time, the p-type layer and the n-type layer are preferably provided to adjoin the first p-type barrier layer 2d and the second n-type barrier layer 2a as shown in FIG. 3, which causes the p-type layer and the n-type layer to be connected directly to the active layer, thereby achieving better injection of the carriers. At this time, while the barrier layers sandwiched by the first p side barrier layer 2d and the second n side barrier layer, the barrier layers 2b, 2c in the case of FIG. 3, for example, are not limited, it is preferable that the layers are doped with the n-type impurity which enables efficient injection of the carriers from the n-type layer thereby improving the reliability of the device.

By making the first p side barrier layer and said second n side barrier substantially equal in thickness, barrier layers are provided with the outermost layers of the active layer being substantially symmetrical, so that variations in the devices are suppressed thereby to improve the yield of production. This is believed to be the result of, through detailed mechanism is not known, the first p side barrier layer and the second n side barrier layer which function as the entrance for injecting the carriers of the p-type layer and the n-type layer being configured symmetrically, which improves the symmetry of the layer structure of the active layer and results in lower threshold current and stable lifetime of the device.

In the fourth embodiment, the active layer has two or more well layers and a third barrier layer disposed between the well layers, while thickness of the third barrier layer is smaller than the thickness of the first p side barrier layer and the second n side barrier layer. This constitution makes it possible to improve the device characteristics further. That is, the second n side barrier layer and the first p side barrier layer which are disposed at the outermost positions of the active layer function as the entrance for injecting the carriers of the p-type layer and the n-type layer, respectively, and have larger thickness than the other barrier layers, so as to secure a space larger enough to hold a large amount of carriers, thus enabling stable operation of the device even with large current. On the other hand, since the third barrier layer is sandwiched by the well layers, it suffices to provide the layer so that the carriers are injected into each well layer and communication between the well layers is achieved, thus it is not necessary to form in large thickness unlike the outermost barrier layers. In addition, with such a structure as the thick barrier layers disposed as the outermost layers and thin barrier layers disposed in the middle of the active layer, the first p side barrier layer and the second n side barrier layer which are thicker than the third barrier layer function as strong barrier layers located on the opposite sides with respect to the n-type layer and the p-type layer while the carriers from the n-type layer and the p-type layer are injected by means of the outer barrier layers, thereby accelerating the injection of the carrier into each well layer and the light emission recombination. Making the third barrier layer thinner than the outer barrier layers makes it possible to keep the total thickness of the active layer small, thus contributing to the decrease in the threshold current density and the value of Vf.

As will be understood from the foregoing description, the first to fourth embodiments have the following features.

In the first to fourth embodiments, injection of the carriers into the active layer is accelerated because the barrier layers (the first barrier layer, the barrier layer $B_L$ and the first p-type barrier layer) which are located nearest to the p-type layer in the active layer do not substantially contain the n-type impurity, thereby achieving the nitride semiconductor device having excellent device lifetime and high output power. Moreover, by including the p-type impurity, injection of carrier and light emission recombination can be done efficiently even with a large amount of carriers, thereby achieving the nitride semiconductor device having excellent device lifetime and high output power. At this time, when the barrier layer located nearest to the p-type layer includes the p-type impurity, the layer is preferably grown undoped or so as not to substantially include n-type impurity. This is because, in case the n-type impurity is included when the barrier layer located nearest to the p-type layer includes the p-type impurity, carrier injection from the p-type layer rends to be impeded leading to weaker effect of injecting a large amount of carriers efficiently, thus resulting in shorter device lifetime and lower output power.

Embodiment 5: Laser Device

The fifth embodiment of the nitride semiconductor device of the present invention is a laser device having at least such a structure as an active layer is sandwiched by an n-type cladding layer and a p-type cladding layer in a p-type nitride semiconductor layer and an n-type nitride semiconductor layer. An optical guide layer which interposes the active layer may also be provided between the cladding layer and the active layer. In the forth embodiment of the present invention, waveguide structure may be applicable not only laser device but also edge emitting LED or super luminescent diode.

Figure 1:
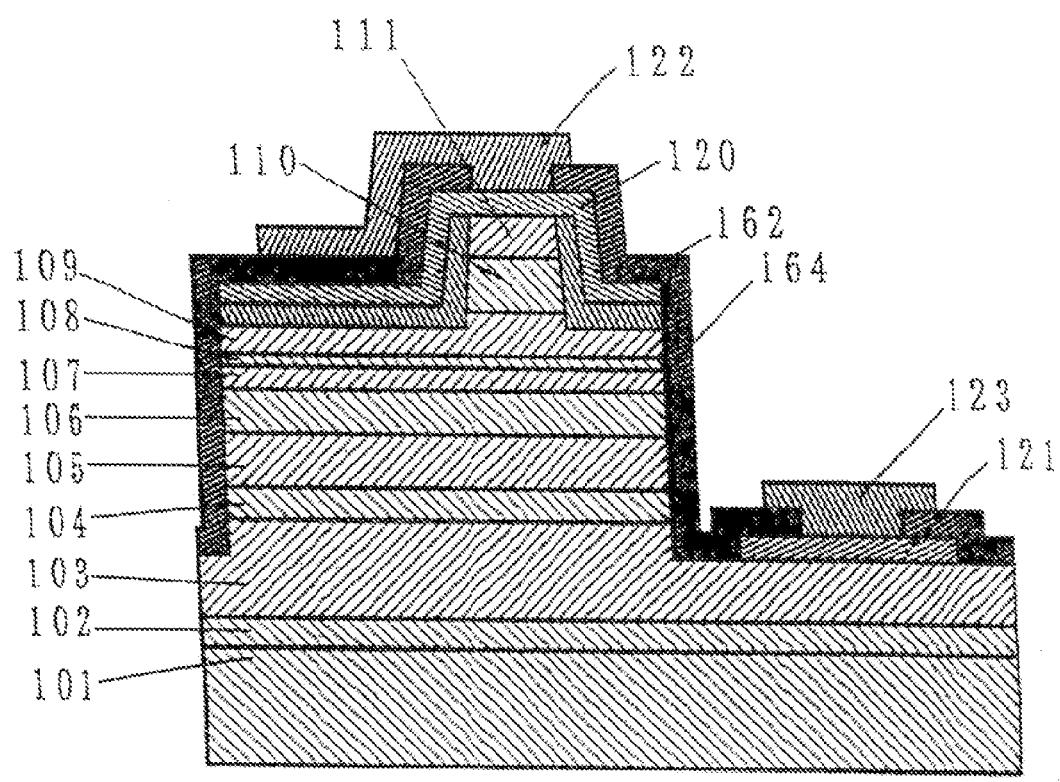
FIG. 1 is a schematic sectional view showing one embodiment of the present invention.

FIG. 1 is a sectional view showing an example of the nitride semiconductor layer of the present invention. An active layer 107 made of $In_xGa_{1-x}N$ ($0 \leq x < 1$) is sandwiched by n-type $Al_yGa_{1-y}N$ ($0 \leq y < 1$) layers 103 to 106 (every layer has different value of y) and p-type $Al_zGa_{1-z}N$ ($0 \leq z < 1$) layers 108 to 111 (every layer has different value of z) on a GaN substrate 101, thus constituting the so-called double hetero structure.

The n-type cladding layer and the p-type cladding layer are made of a nitride semiconductor which includes Al, and specifically $Al_bGa_{1-b}N$ ($0 < b < 1$) is preferably used.

According to the present invention, there is no limitation to the composition of the optical guide layer which is required only to have a sufficient energy band gap for forming the waveguide, whether made in single film or multiple-film constitution. For example, refractive index of the waveguide can be made higher by using GaN for wavelengths from 370 to 470 and using multiple-film constitution of InGaN/GaN for longer wavelengths. Thus various nitride semiconductors such as InGaN, GaN and AlGaN can be used. The guide layer and the cladding layer may also be made in super lattice multiple-film structure.

Now detailed structure of the nitride semiconductor laser shown in FIG. 1 will be describe below. Formed on the substrate 101 via the buffer layer 102 are the n-type contact layer 103 which is an n-type nitride semiconductor layer, the crack preventing layer 104, the n-type cladding layer 105 and the n-type optical guide layer 106. Layers other than the n-type cladding layer 105 may be omitted depending on the device. The n-type nitride semiconductor layer is required to have a band gap wide than the active layer at least in a portion which makes contact with the active layer, and therefore preferably has a composition which includes Al. The layers may also be made n-type either by growing while doping with an n-type impurity or by growing undoped.

The active layer 107 is formed on the n-type nitride semiconductor layers 103 to 106. The construction of the active layer is as described previously.

Formed on the last barrier layer are the p-type electron confinement layer 108 as the p-type nitride semiconductor layer, a p-type optical guide layer 109, a p-type cladding layer 110 and a p-type contact layer 111. Layers other than the p-type cladding layer 110 may be omitted depending on the device. The p-type nitride semiconductor layer is required to have a band gap wide than the active layer at least in a portion which makes contact with the active layer, and therefore preferably has a composition which includes Al. The layers may be made p-type either by growing while doping with a p-type impurity or by using the diffusion of the p-type impurity from the other layer which adjoins thereto.

The p-type electron confinement layer 108 made of a p-type nitride semiconductor layer which includes Al in a proportion higher than in the p-type cladding layer 110, preferably having a composition of $Al_xGa_{1-x}N$ ($0.1 < x < 0.5$). This layer is also heavily doped with a p-type impurity such as Mg preferably in a concentration from $5 \times 10^{17}/cm^3$ to $1 \times 10^{19}/cm^3$. This makes the p-type electron confinement layer 108 capable of effectively confining electrons within the active layer, thus decreasing the threshold of the laser. The p-type electron confinement layer 108 may be formed in a thin film of about 30 to 200 Å. Such a thin film can be grown at a temperature lower than the temperature for growing the p-type optical guide layer 109 and the p-type cladding layer 110. By forming the p-type electron confinement layer 108 as described above, decomposition of the active layer which includes In can be suppressed compared to the case where the p-type optical guide layer 109 and the like are formed directly on the active layer.

The p-type electron confinement layer 109 plays the role of supplying the p-type impurity through diffusion into the last barrier layer which is grown undoped. These layers work in cooperation to protect the active layer 107 from decomposition and improve the efficiency of injecting holes into the active layer 107. That is, by forming the undoped $In_{x2}Ga_{1-x2}N$ well layer ($0 \leq x_2 < 1$) as the last layer of the MQW active layer to be thicker than the other barrier layers and growing thereon the thin film made of p-type $Al_xGa_{1-x}N$ ($0.1 < x < 0.5$) heavily doped with the p-type impurity such as Mg at a low temperature, it is made possible to protect the active layer 107 from decomposition and improve the efficiency of injecting holes into the active layer through diffusion of the p-type impurity such as Mg from the p-type $Al_xGa_{1-x}N$ layer into the undoped $In_{x2}Ga_{1-x2}N$ layer.

Among the p-type nitride semiconductor layers, ridge stripe is formed up to midway in the p-type optical guide layer, and the semiconductor laser is made by forming protective films 161, 162, a p-type electrode 120, an n-type electrode 121, a p-type pad electrode 122 and an n-type pad electrode.

(Eelectron Confinement Layer: First p-Type Nitride Semiconductor Layer)

According to the present invention, the first p-type nitride semiconductor layer is preferably provided as the p-type nitride semiconductor layer particularly in the laser device. The first p-type nitride semiconductor layer is made of a nitride semiconductor which includes Al, and specifically $Al_aGa_{1-a}N$ ($0 < a < 1$) is preferably used. The proportion γ of Al is determined so the layer functions as the electron confinement layer when used in a laser device which requires it that a sufficiently larger band gap energy is provided (offset) than that of the active layer, and is set at least in a range of $0.1 \leq γ < 1$, and preferably in a range of $0.2 \leq γ < 0.5$. This is because the value of γ less than 0.1 makes it unable to fully function as the electron confinement layer in the laser device. When the value of γ is 0.2 or greater, electrons (carrier) can be sufficiently confined and carrier overflow can be suppressed. When the value of γ is not larger than 0.5, the layer can be grown while minimizing the occurrence of cracks. Further, the value of γ is preferably set to 0.35 or less which allows it to achieve good crystallinity. At this time, proportion of Al in the composition is set higher than in the p-type cladding layer, because confinement of the carrier requires a nitride semiconductor having higher proportion of Al than in the cladding layer which confines light. The first p-type nitride semiconductor layer can be used in the nitride semiconductor device of the present invention and, particularly in the case of a laser device which is driven with a large current while injecting a large amount of carriers into the active layer, the carriers can be confined more efficiently than in the case where the first p-type nitride semiconductor layer is not provided, making applicable to high output LEDs as well as the laser device.

Thickness of the first p-type nitride semiconductor layer of the present invention should be not larger than 1000 Å, preferably 400 Å or smaller. This is because the nitride semiconductor which includes Al has bulk resistance higher than other types of nitride semiconductor (without Al content), and therefore makes a layer of extremely high resistance when formed with a thickness greater than 1000 Å, thus resulting in a significant increase in the forward voltage Vf. When the thickness is not larger than 400 Å, the increase in Vf can be kept at a low level. More preferably the thickness is 200 Å or less which makes it possible to suppress the increase in Vf even lower. Lower limit of the thickness of the first p-type nitride semiconductor layer is 10 Å or larger, preferably 50 Å or larger, which allows the electron confinement layer to function satisfactorily.

In the laser device, the first p-type nitride semiconductor layer is provided between the active layer and the cladding layer so as to function as an electron confinement layer or, when a guide layer is additionally provided, provided between the guide layer and the active layer. At this time, the distance between the active layer and the first p-type nitride semiconductor layer is not larger than 1000 Å which enables it to function as the carrier confinement layer, and preferably 500 Å or smaller for better carrier confinement. This is because the first p-type nitride semiconductor layer has better effect of carrier confinement when nearer to the active layer. Moreover, since it is not necessary to have another layer between the active layer and the first p-type nitride semiconductor layer in most cases in the laser device, it is usually most preferable to provide the first p-type nitride semiconductor layer so as to make contact with the active layer. At this time, in case the crystallinity is adversely affected by providing the layer located nearest to the p-type nitride semiconductor layer in the active layer of the quantum well structure and the first p-type nitride semiconductor layer in contact with each other, a buffer layer may be provided between both layers when growing the crystal, in order to avoid the adverse effect. For example, a buffer layer made of GaN may be provided between the outermost p side layer of the active layer and the first p-type nitride semiconductor layer such as InGaN or AlGaN, or a buffer layer made of nitride semiconductor which includes Al in lower proportion than that in the first p-type nitride semiconductor layer may be provided.

The positional relationship between the first p-type nitride semiconductor layer and the active layer, particularly the distance from the well layer is an important factor that determines the threshold current density and lifetime of the laser device. Specifically, the threshold current density can be made lower as the first p-type nitride semiconductor layer is located nearer to the active layer, but this also leads to shorter lifetime of the device. This is supposedly because, as described above, the first p-type nitride semiconductor layer has a resistance far higher than that of the other layer and generates greater heat during operation of the device thus reaching a higher temperature in the device. This may be affecting the active layer and the well layers which are vulnerable to heat, thus causing the device lifetime significantly. On the other hand, as described above, the first p-type nitride semiconductor layer which bears the function of carrier confinement can perform more effective carrier confinement function when located nearer to the active layer, with the effect diminishing as the distance from the active layer increases.

Figure 8A:
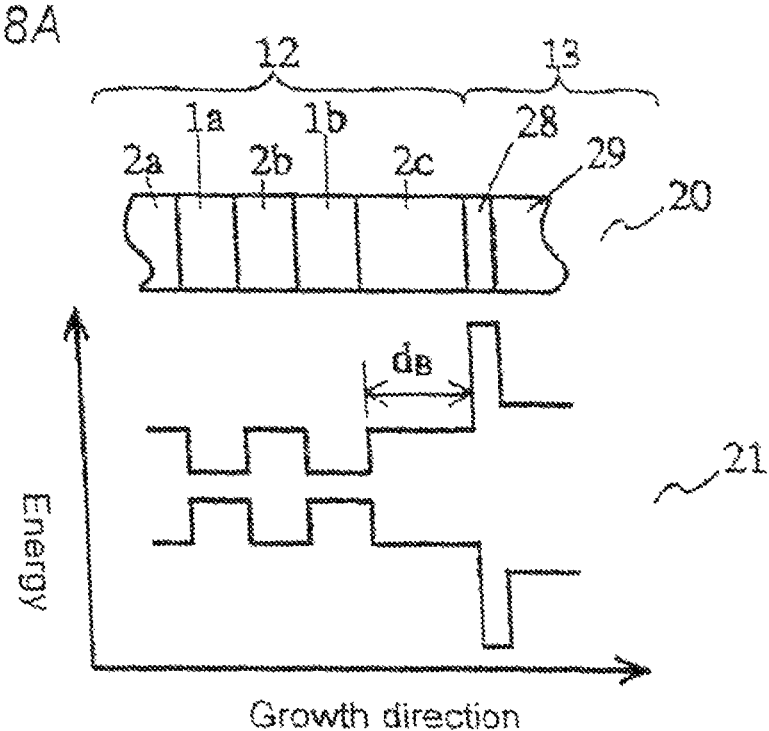
FIGS. 8A and 8B is a schematic sectional view of stacked structure and schematic diagram showing band structure according to one embodiment of the present invention.

Therefore, keep the lifetime of the device from decreasing, distance $d_B$ between the well layer 1 and the first p-type nitride semiconductor layer 28 should be 100 Å or larger, preferably 120 Å or larger, and most preferably 140 Å or larger as shown in FIG. 8A. When the distance $d_B$ between the well layer and the first p-type nitride semiconductor layer is shorter than 100 Å, the device lifetime decreases sharply. When the distance is not less than 120 Å, the device lifetime can be increased significantly. When the distance is larger than 150 Å, the device lifetime increases further, while the threshold current density begins to gradually increase. When the distance is larger than 200 Å, the threshold current density shows clear tendency to increase and, beyond 400 Å, the threshold current density increases sharply. Accordingly, upper limit of the distance is set within 400 Å, preferably within 200 Å. The mechanism behind this is believed to be such that the efficiency of carrier confinement decreases as the first p-type nitride semiconductor layer departs from the well layer, which becomes the major cause and increase in the threshold current density, resulting in the decrease in the efficiency of light emission.

The well layer used as the datum for distance is the well layer 1b which is disposed on the side of the n-type layer while adjoining the barrier layer 2c provided nearest to the p-type layer 13 in the active layer. In case the first p-type nitride semiconductor layer is provided in contact with the active layer of quantum well structure, either the constitution shown in FIG. 8A wherein the first p-type nitride semiconductor layer 28 is provided in contact with the barrier layer 2c located nearest to the p-type layer side or the constitution shown in FIG. 8B wherein the well layer 4 is provided between the first p-type nitride semiconductor layer 28 and the barrier layer 2c located nearest to the p-type layer 13 side may be employed. In the constitution where the well layer 4 is provided between the first p-type nitride semiconductor layer 28 and the barrier layer 2c located nearest to the p-type layer 13 side, the well layer 4 becomes too near to the p-type layer 13, so that most of the carriers injected from the p-type layer pass through the well layer 4 without experiencing light emission recombination in the well layer 4, thus the function of the well layer is not performed. In case the barrier layer 2c located nearest to the p-type layer side includes the p-type impurity, the carriers can be injected better into the well layers 1a, 1b which are located nearer to the n-type layer side than the barrier layer 2c, while the carriers pass through the well layer 4 which is located nearer to the p-type layer side than the barrier layer 2c, thus further losing the contribution to light emission recombination and the function of the well layer is rapidly lost. For this reason, between the well layer 4 and the first p-type nitride semiconductor layer shown in FIG. 8B, there is no change in the characteristic due to the distance as described above, and the distance $d_B$ from the well layer becomes the distance from the well layer located at a position nearer to the n-type layer side than the barrier layer nearest to the p-type layer regardless of the well layer 1c located at a position nearer to the p-type layer side than the barrier layer nearest to the p-type layer. And even when a well layer which becomes the layer nearest to the p-type layer is provided in the active layer, change in the characteristics due to the distance $d_B$ as described above is observed. Such a well layer which is located at a position nearer to the p-type layer side than the barrier layer nearest to the p-type layer does not fully function as a well layer, and also cause the device characteristics such as lifetime to deteriorate compared to a case where the well layer is not provided. Therefore, such a constitution is preferably employed as a layer located nearest to the p-type layer in the active layer is used as the barrier layer without providing the well layer, as shown in FIG. 8A rather than that shown in FIG. 8B.

In case the first p-type nitride semiconductor layer 28 is provided in contact with the barrier layer 2c located nearest to the p-type layer side, the barrier layer 2c (barrier layer nearest to the p-type layer side) may be provided between the well layer and the first p-type nitride semiconductor layer, so as to determine the distance $d_B$ by the thickness of this barrier layer. Therefore, thickness of the barrier layers (the first barrier layer, the barrier layer $B_L$ and the first p-type barrier layer) which are located nearest to the p-type layer becomes an important factor that determines the characteristics of the nitride semiconductor device. In addition, since the increase in the threshold current density of a laser device is caused mainly by the confinement of the carrier described above, the relationship between the active layer and the first p-type nitride semiconductor layer applies here again.

The first p-type nitride semiconductor layer of the present invention is usually doped with a p-type impurity, and is doped with a high concentration in order to improve the carrier mobility in the case of a laser device or a high power LED which are driven with a large current. Specifically, doping concentration is $5\times10^{16}/cm^3$ or higher, and preferably $1\times10^{18}/cm^3$ or higher. In the case of a device driven with a large current, doping concentration is $1\times10^{18}/cm^3$ or higher, and preferably $1\times10^{19}/cm^3$ or higher. Concentration of the p-type impurity is not limited, but is preferably $1\times10^{21}/cm^3$ or higher. However, when the concentration of the p-type impurity is too high, bulk resistance tends to increase resulting in higher value of Vf. In order to avoid this problem, minimum necessary concentration of p-type impurity to secure the required level of carrier mobility is preferably provided. In case a p-type impurity which has a strong tendency to diffuse such as Mg is used, the first p-type nitride semiconductor layer may be grown without doping and then doped by the diffusion of impurity from an adjacent layer, for example, an optical guide layer. Or, alternatively, in case the first p-type nitride semiconductor layer is grown without doping while a layer doped with the p-type impurity exists other than the adjacent layer or the p-type impurity diffused region, and diffusion of impurity does not occur in the first p-type nitride semiconductor layer, then the layer may be provided undoped when the thickness allows the carrier to tunnel therethrough.

In addition to the above, in the laser device of the present invention, in case a p-type optical guide layer is provided in contact with the first p-type nitride semiconductor layer, a good optical guide layer is obtained by doping with a p-type impurity by the diffusion from the first p-type nitride semiconductor layer. Since the p-type impurity in the guide layer scatters light in the optical waveguide, inclusion of impurity with as low concentration as possible within such a range that ensures electrical conductivity is preferable for improving the device characteristics. However, doping with p-type impurity when growing the p-type optical guide layer has a problem of difficulty to control the doping with impurity in a low concentration region where the loss of light can be kept low. This is because, while the nitride semiconductor device generally has such a structure as an n-type layer, an active layer and a p-type layer are stacked in this order, it is necessary to prevent In from decomposing during the subsequent process of growing the layers because of InGaN included in the active layer, when this structure is grown. Although a method of growing the p-type layer at a low temperature in a range from 700 to 900° C. is commonly employed, it becomes difficult to control the doping impurity concentration because of the low temperature. Also Mg is commonly used as the p-type impurity, it is relatively difficult to control the doping impurity concentration, and variations may be caused in the device characteristics when doping the impurity in the low concentration region when growing.

Therefore, it is preferable that the first p-type nitride semiconductor layer plays the role of the impurity supplying layer by doping the first p-type nitride semiconductor layer with the impurity in a high concentration during growth thereof, while giving consideration to the diffusion of the p-type impurity into the optical guide layer. Further in the embodiments described above, the barrier layers (the first barrier layer, the barrier layer $B_L$ and the first p-type barrier layer) which are disposed in contact with the first p-type nitride semiconductor layer can also be caused to play the role of the impurity supplying layer by doping with the p-type impurity, too.

In the laser device of the present invention, as shown in the embodiments, an insulation film which becomes a buried layer is formed in the side face of a ridge after forming the ridge. For the buried layer, a material other than $SiO_2$, preferably an oxide which includes at least one kind of element selected from among a group consisting of Ti, V, Zr, Nb, Hf and Ta, or at least one of SiN, BN, SiC and AlN is used and, among these, it is particularly preferable to use an oxide of Zr or Hf, or BN, SiC. As the buried layer, half-insulating i-type nitride semiconductor; a nitride semiconductor of conductivity type opposite to that of the ridge (n-type in the case of the embodiment); a nitride semiconductor including Al such as AlGaN (when current pinching layer is needed) can be used. Alternatively, in order to form light wave guide, the buried layer is made to absorb much more light than the ridge part by employing nitride semiconductor layer including In (such as InGaN) as the buried layer. Such a structure may also be employed as ions of elements such as B or Al are injected without forming a ridge by etching or the like, while forming a region without the ion being injected which is the current flowing region. At this time, nitride semiconductor represented as $In_xAl_{1-y}Ga_{1-x-y}N$, $0 \le x \le 1$, $0 \le y \le 1, x+y=1$).

The first p-type nitride semiconductor layer of the present invention performs carrier confinement as described above, and the first p-type nitride semiconductor layer can be applied as a cladding layer even when only the classing layer for carrier confinement is provided without needing an optical confinement cladding layer in a light emitting device, as shown in an embodiment.

Moreover, while the first p-type nitride semiconductor layer has such a constitution as band offset is provided between the active layer in order to confine electrons in the active layer, namely making the band gap energy higher than that in the active layer with a voltage barrier between both layers, it is preferable to provide band gap energy higher than that in the guide layer in a laser device of SCH structure. In case cladding layer comprising two or more layers of different band gap energies is provided, the first p-type nitride semiconductor layer is provided in the cladding layer on the active layer side, preferably with band gap energy higher than that in the other layers. Specifically, such a structure may be employed as the first p-type nitride semiconductor layer having a high band gap energy is used as the first cladding layer and a second cladding layer having lower band gap energy is disposed more distantly from the active layer than the first cladding layer, such as the structure of the first embodiment minus the guide layer.

Figure 8B:
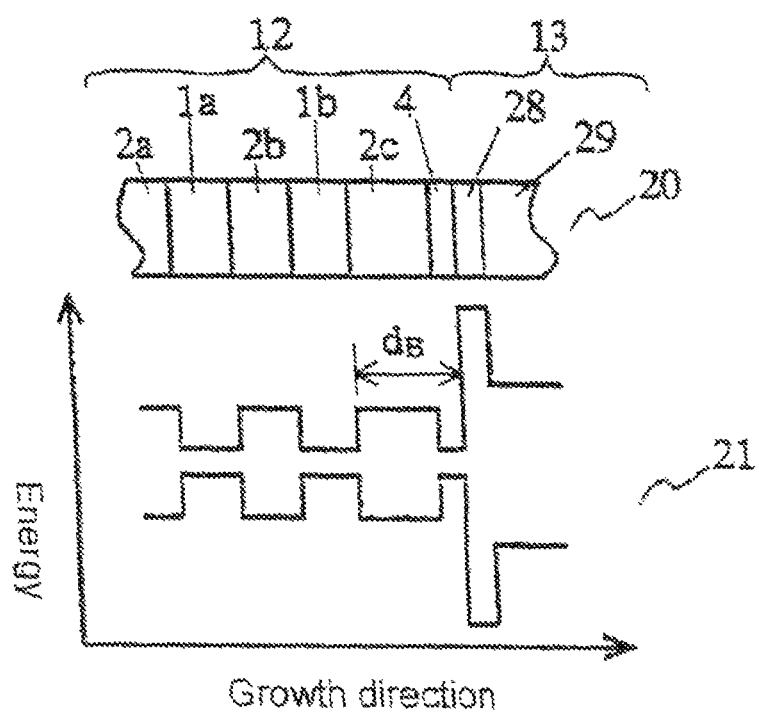

As described above, when the first barrier layer (barrier layer nearest to the p side) is considered based on the first p-type nitride semiconductor layer, with regards to the carrier confinement in the active layer being determined by the first p-type nitride semiconductor layer which plays the role of carrier confinement in the band structure shown in FIGS. 8A and 8B, the active layer may be the region from the position of making contact with the first p-type nitride semiconductor layer in the present invention. That is, in case the barrier layer nearest to the p side has a function different from that of the other barrier layer, because of the close relationship with the first p-type nitride semiconductor layer which plays the role of carrier confinement as described above, the region from the interface in contact with the first p-type nitride semiconductor layer can be regarded as the active layer. Thus in consideration of the fact that the region from the position of making contact with the first p-type nitride semiconductor layer is the active layer, the effect of the first barrier layer, the barrier layer nearest to the p side of the present invention can be achieved even when some layer, such as the well layer 4 shown in FIG. 8B, for example, is interposed between the first barrier layer and the first p-type nitride semiconductor layer. Specifically, in addition to the embodiment shown in FIG. 8B, a layer having an intermediate band gap energy may be interposed between the first barrier layer and the first p-type nitride semiconductor layer. Moreover, as described above, since the first barrier layer, the barrier layer nearest to the p side have a function significantly different from the other barrier layer, for example the barrier layer sandwiched by the well layers, the layer may have different composition and band gap energy.

By setting the ridge width in a range from 1 μm to 3 μm, preferably from 1.5 μm to 2 μm, light source for an optical disk system having good spot shape and beam configuration can be obtained. The laser device of the present invention is not limited to the refractive index guiding type waveguide of ridge structure, and gain guiding type may be employed. Also the BH structure where ridge side face is buried by regrowth, a structure having a ridge buried by regrowth, or a structure having current pinching layer may be employed, and the active layer described above is effective for any laser device structure.

Embodiment 6

The sixth embodiment is the nitride semiconductor device described above having such a laser device structure as the active layer of quantum well structure is sandwiched between an upper cladding layer made of a nitride semiconductor including Al and a lower cladding layer made of a nitride semiconductor including Al, wherein the upper cladding layer and the lower cladding layer include Al in mean proportion x being 0<x≤0.05. This constitution makes it possible to loosen the confinement in the optical waveguide sandwiched by the upper cladding layer and the lower cladding layer by controlling the proportion of Al in the cladding layers to 0.05 or less, and suppressing the self-excited oscillation by controlling the thickness ratio of the barrier layer and the well layer of the active layer, thereby improving the output characteristic and the lifetime of the device. The laser device made in this constitution is capable of continuous oscillation with an output power of 5 to 100 mW, thus making a laser device having characteristics suitable for the reading and writing light sources of an optical disk system while achieving a longer lifetime of the device. Preferably, as shown in FIGS. 3, 4, 6, 7, an optical guide layer is provided between the upper and the lower cladding layers so as to difference in the refractive index in the cladding layers and spread the distribution of light, which causes the light to be distributed widely in the guide layer thereby decreasing the loss due to leaking light.

When the well layer has thickness of 40 Å or larger and the thickness ratio $R_t$ is in a range from ⅓ to 1 in the active layer, the device characteristics can be improved in the first to fourth embodiments and in the fifth embodiment. Although the mechanism which improves the device characteristics is not known, such a structure has been used in the prior art as the probability of light emission recombination to occur in the well layer is increased by providing a barrier thickness sufficiently thicker than the well layer. In contrast, in the active layer described above, the well layer is made as thick as 40 Å or larger and the barrier layer is made thinner compared to the well layer. Thus the thick well layer provides greater region for light emission recombination to occur, and the thin barrier layer provided between the well layers allows the carriers to be injected evenly into the well layers, thus increasing the probability of light emission recombination to occur. In the case of a high output device, while a large amount of carriers are injected into the well layer because of driving with a large current, the thick well layer provides greater region for light emission recombination to occur, and the thin barrier layer tends to enable uniform injection into the well layers passing through the barrier layer.

Figure 12:
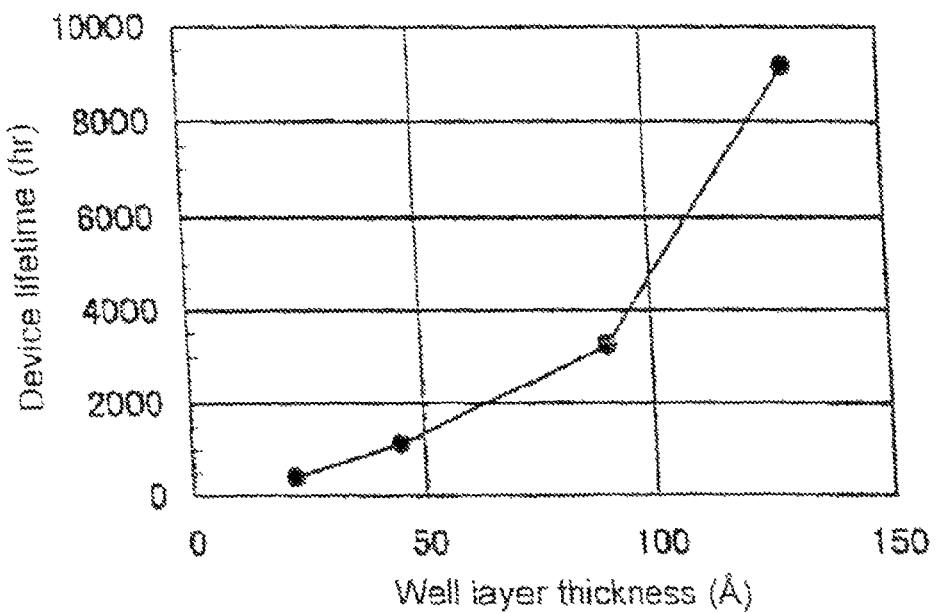
FIG. 12 is a diagram showing the relationship between the device lifetime and well layer thickness in one embodiment of the present invention.
Figure 13:
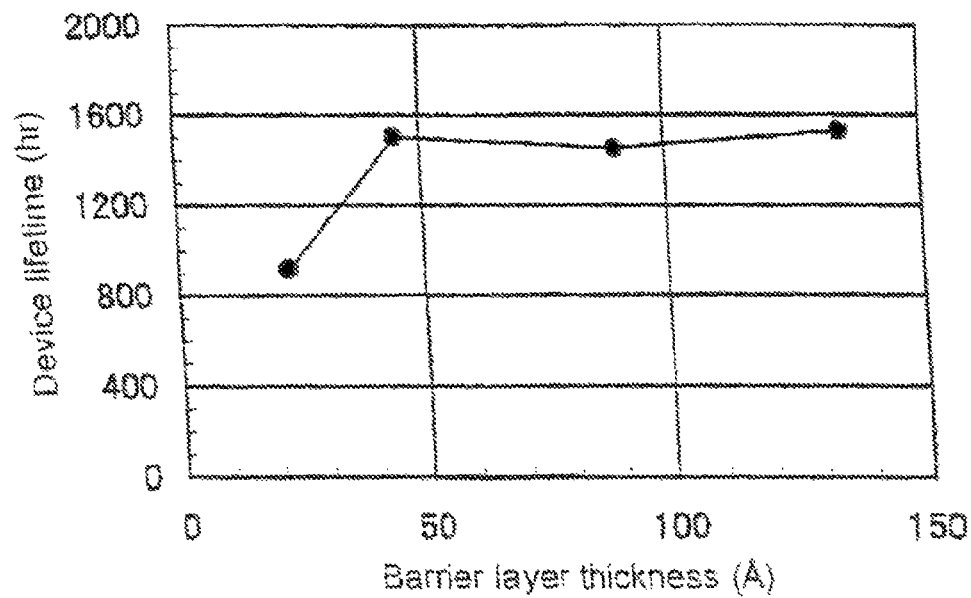
FIG. 13 is a diagram showing the relationship between the device lifetime and barrier layer thickness in one embodiment of the present invention.

When the well layer has thickness of 40 Å or larger and the thickness ratio $R_t$ ($R_t$=[thickness of well layer]/[thickness of barrier layer]) is in a range from ⅓ to 1 in the active layer, the laser device having excellent characteristics for the light source of an optical disk system is obtained. This is because making the well layer 40 Å or thicker results in the long lifetime of the device as shown in FIG. 12, and setting in the range described above keeps the value of RIN (relative intensity of noise) low. More preferably, thickness of the well layer is set to 50 Å or larger which makes it possible to increase the device lifetime further. When the value of $R_t$ is 1 or greater, although the value of RIN increases, device lifetime becomes longer and a laser device having a large output power can be made, thus allowing applications other than the optical disk system. Based on the foregoing discussion, thickness of the barrier layer is preferably 40 Å or larger because this provides the laser device having long lifetime as shown in FIG. 13.

Embodiment 7: Number of Well Layers

In the first to sixth embodiments described above, the number of well layers provided in the active layer is set in a range from 1 to 3 a nitride semiconductor device having good device characteristics performed even under operation with a large current can be obtained. In the prior art, while the number of well layers in the active layer has been set in a range from about 4 to 6, the large number of the well layers increases the probability of the carrier recombination but the total thickness of the active layer including the barrier layer becomes larger and tends to increase the value of Vf. Also it has been found that increasing the number of well layers does not cause a corresponding increase in the probability of the carrier recombination. In the case of LD which is driven with a large current and high current density, in particular, this tendency is observed more markedly. In the case of LD, for example, when the number of well layers is changed in multiple quantum well structure, threshold current tends to decrease as the number of well layers decreases, and shows sharp decrease while the number of well layers decreases from 6 to 4, gradual decrease as the number decreases from 4 to 3, reaches a minimum value the number of well layers is 2 or 3. When the number of well layer is 1, namely in the case of single quantum well structure, threshold current becomes equal to or a little higher than that of the case where the number of well layers is 2 or 3. Similar tendency is seen also in an LED of high output power.

Figure 4:
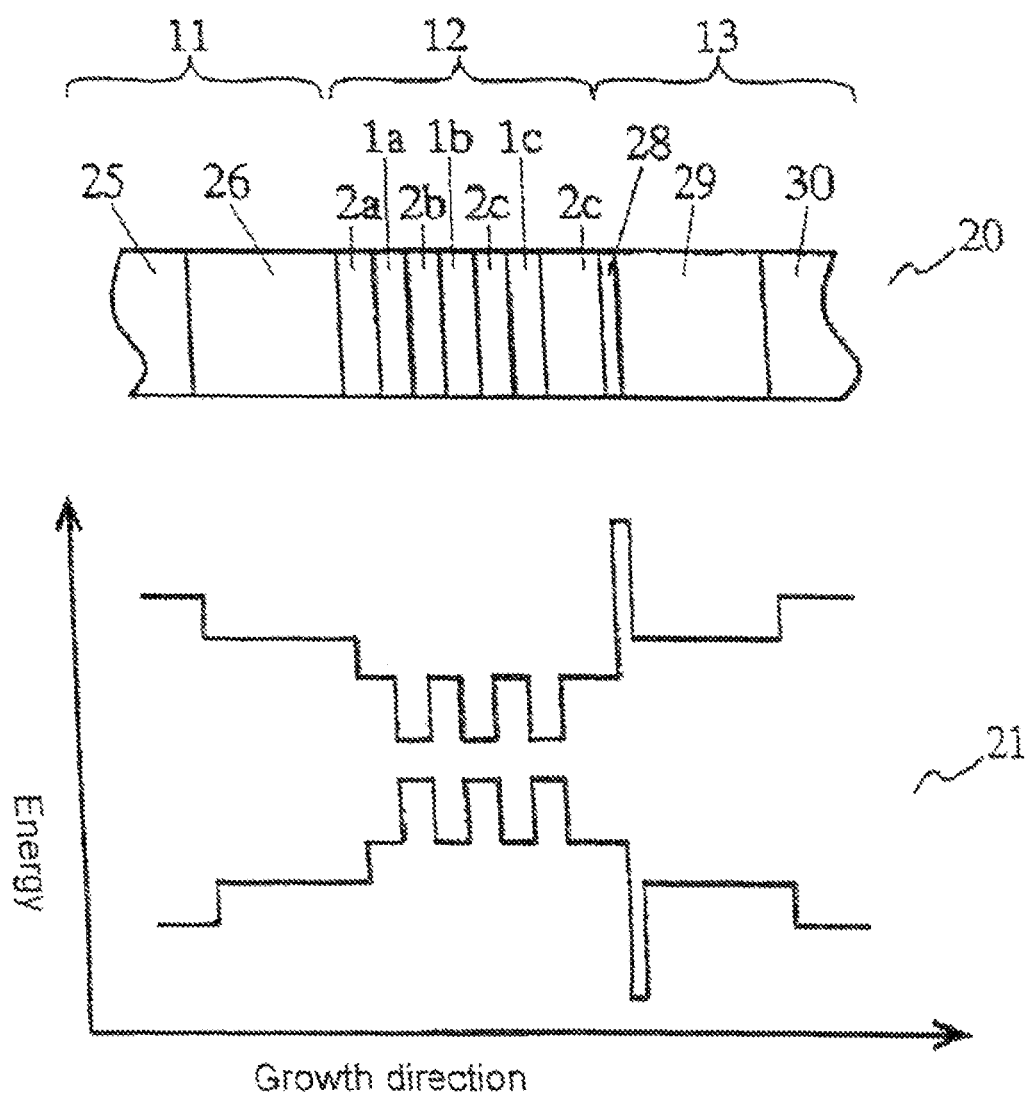
FIG. 4 is a schematic sectional view of stacked structure and schematic diagram showing band structure according to one embodiment of the present invention.
Figure 5:
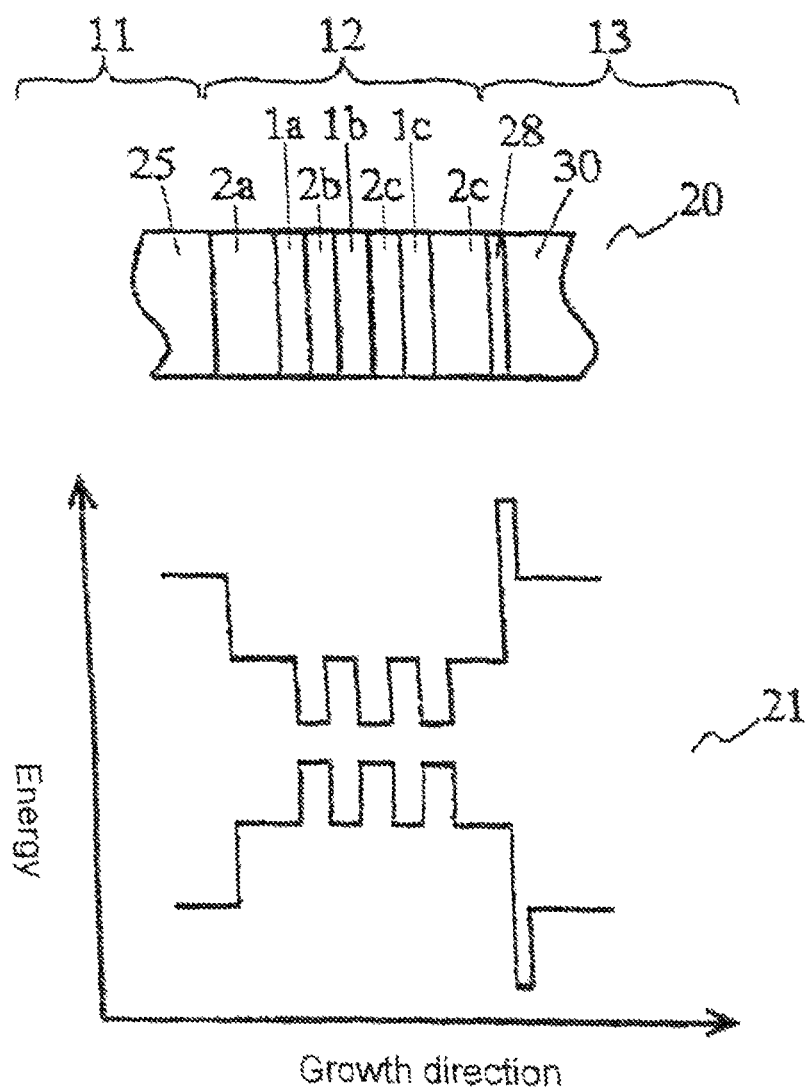
FIG. 5 is a schematic sectional view of stacked structure and schematic diagram showing band structure according to one embodiment of the present invention.
Figure 6:
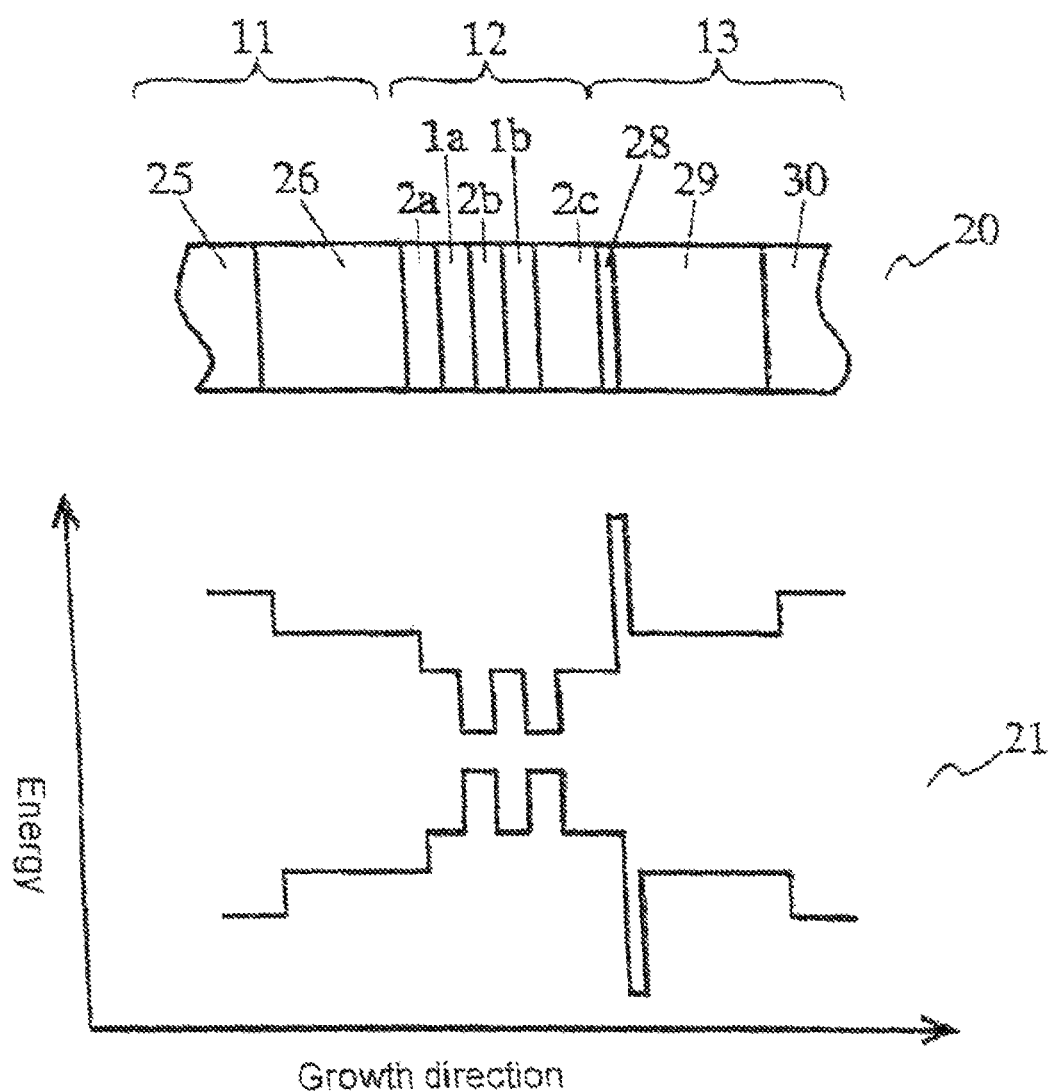
FIG. 6 is a schematic sectional view of stacked structure and a schematic diagram showing band structure according to one embodiment of the present invention.
Figure 7:
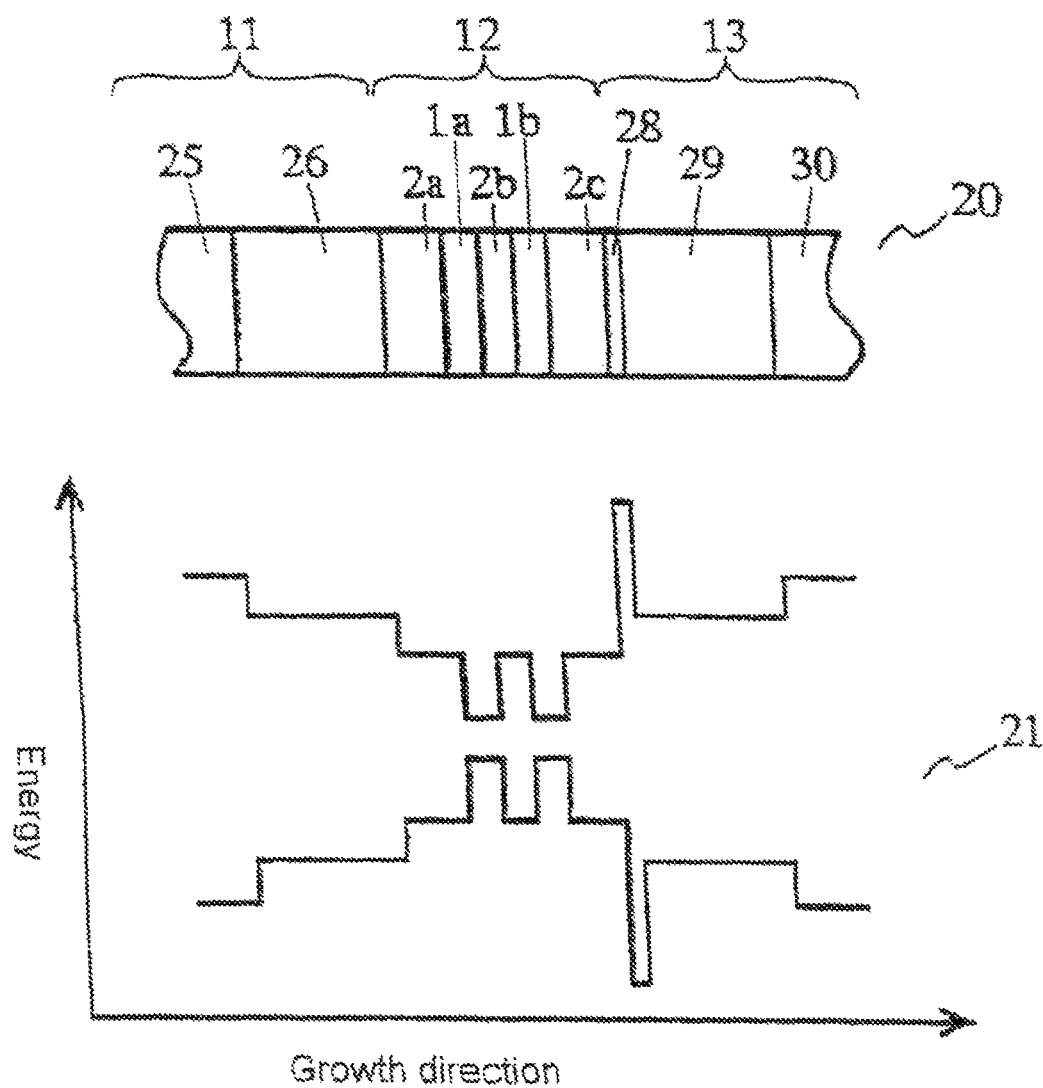
FIG. 7 is a schematic sectional view of stacked structure and a schematic diagram showing band structure according to one embodiment of the present invention.

The accompanying drawings will be described below. FIGS. 2, 3 are schematic sectional views of an embodiment of the present invention, particularly showing a structure of a laser device where an active layer 12 is sandwiched by an n-type layer 11 and a p-type layer 13. FIG. 2 shows a structure where the active layer 12 is sandwiched by an upper cladding layer 30 and a lower cladding layer 25, a first p-type nitride semiconductor layer 28 which is an electron confinement layer is provided between the active layer 12 and the upper cladding layer 30, with the quantum well structure of the active layer 12 being made by stacking pairs of barrier layer 2a/well layer 1a repetitively and providing the barrier layer 2c at the end. Difference of the structure shown in FIG. 3 from that of FIG. 2 is that upper and lower optical guide layers 29, 26 are provided between the upper and lower cladding layers 30, 25 and the active layer 12. FIGS. 4 to 8 and FIG. 10 show stacked structure 20 of or around the active layer 12 and an energy band gap 21 provided below and corresponding to the stacked structure 20. FIGS. 4, 6 show the quantum well structure of the active layer 12 having an asymmetrical structure with regard to the film thickness. FIGS. 5, 7 show, on the contrary, a symmetrical structure. The number of the well layers in the active layer is 3 in FIGS. 4, 5 and 2 in FIGS. 6, 7. FIG. 5 shows a structure without optical guide layer, while FIGS. 4, 7, 8 show a structure having optical guide layer. FIG. 8 shows a structure where the active layer 12 and the p-type layer 13 are stacked, showing the relationship between the first p-type nitride semiconductor layer 28 and the active layer in the p-type layer 13, the barrier layer 2c provided at a position nearest to the p-type layer side and the well layer 1b located nearer to the n-type layer than the barrier layer 2c.

Embodiment 8

The eighth embodiment of the present invention provides a laser device having fast response characteristics and RIN suitable for optical disk systems such as DVD and CD. Specifically, the active layer of quantum layer structure comprises a first barrier layer (barrier layer disposed nearest to the p side) and a second barrier layer the ratio Rt of thickness between the well layer and the second barrier layer is in a range of $0.5 \leq R_t \leq 3$. The first barrier layer (barrier layer disposed nearest to the p side) and the second barrier layer are similar to those of the embodiments described above. With this thickness ratio, it is important that the second barrier layer be the barrier layer sandwiched by the well layers in the MQW, namely at the distance between the well layers. As described above, since the barrier layer located nearest to the p side and the other barrier layers have different functions, for the barrier layers which affect the response characteristics and RIN, the barrier layers other than the first barrier layer (barrier layer disposed nearest to the p side) are important. Particularly in the MQW, ratio of the thickness of the barrier layer sandwiched by the well layers and the thickness of the well layer have a great influence on the characteristics described above. When the thickness ratio $R_t$ is within the range described above, a good laser device suited to the light source of an optical disk system is obtained. When the ratio is below 0.5, thickness of the barrier layer becomes too large compared to the well layer leading to a degradation in the response characteristic. When the ratio exceeds 3, RIN is adversely affected thus making a light source having significant noise when high frequency is superimposed. The ratio is preferably set in a range of $0.8 \leq R_t \leq 2$ which leads to a laser device excellent in the characteristics described above. At this time, film thickness $d_w$ of the well layer is preferably in a range of $40 \text{ Å} \leq d_w \leq 100 \text{ Å}$. This is because better device lifetime can be achieved as the well layer becomes thicker in the embodiments described above as will be seen from FIG. 12. When the film thickness is larger than 100 Å, degradation of the response characteristics and RIN becomes more significant thus making the device not suitable for the light source of an optical disk system. The thickness is preferably in a range of $60 \text{ Å} \leq d_w \leq 80 \text{ Å}$. This is because, while thicker well layer leads to slower rate of deterioration which is another criterion for evaluating the lifetime of the device, the rate of deterioration shows a sharp decrease when thickness of the well layer is increased in a range from 40 Å to 80 Å, and shows a gradual decrease when the thickness exceeds 80 Å. The film thickness $d_b$ of the second barrier layer is set to 40 Å or larger for the consideration to the relation between the film thickness and the device lifetime shown in FIG. 13, and a laser device of excellent device lifetime is obtained in this range of thickness.

This embodiment is preferably combined with the first to seventh embodiment. The second barrier layer is at least the barrier layer provided in the active layer in the embodiment shown in FIGS. 6, 7, and is applied to some of the barrier layers other than the barrier layer 2c provided at a position nearest to the p-type layer side (first barrier layer). Preferably it is applied to the barrier layer 2b sandwiched by the well layers, and most preferably applied to all the barrier layers other than the barrier layer nearest to the p side, because this improves the characteristics described above.

EXAMPLE 1

Now a laser device made of the nitride semiconductor device having the laser device structure as shown in FIG. 8 will be described below as an example.

While the substrate 101 is preferably made of GaN, a substrate of a material different from the nitride semiconductor may also be used. The substrate of different material may be made of an insulating substance such as sapphire or spinel ($MgAl_2O_4$) having principal plane in the C plane, R plane or A plane, or SiC (6H, 4H, 3C), ZnS, ZnO, GaAs, Si or a material other than nitride semiconductor which has been known to be capable of growing nitride semiconductor such as an oxide that undergoes lattice matching with the nitride semiconductor. Preferred material for making the substrate of different material is sapphire or spinel. The substrate of different material may be an off-angle one, in which case it has preferably stepwise off-angle construction for this allows base layer of gallium nitride to grow with good crystallinity. When a substrate of different material is used, devices may be formed in the form of single substrate of nitride semiconductor by removing the substrate of different material by polishing or other method after growing the nitride semiconductor which makes the base layer on the substrate of different material before forming the device structure, or alternatively the substrate of different material may be removed after forming the devices.

In case the substrate of different material is used, the nitride semiconductor can be grown satisfactorily when the devices are formed via the base layer made of a buffer layer (low-temperature grown layer) and nitride semiconductor (preferably GaN). For the base layer (growth substrate) provided on the substrate of different material, nitride semiconductor grown by ELOG (Epitaxially Laterally Overgrowth) may also be used which allows it to obtain a growth substrate of good crystallinity. Specific examples of ELOG growth layer include one where a nitride semiconductor layer is grown on a substrate of different material, whereon a mask region is formed by, for example, providing a protective film which makes it difficult to grow the nitride semiconductor, and a non-mask region is formed in stripes for growing the nitride semiconductor, while the nitride semiconductor is grown through the non-mask region so that the growth proceeds in the lateral direction as well as in the direction of thickness, thereby forming a layer with the nitride semiconductor growing also in the mask region. In other aspect, the layer may also be formed by making an aperture in the nitride semiconductor grown on the substrate of different material and making lateral growth from the side face of the aperture.

(Substrate 101)

For the substrate, a nitride semiconductor, GaN in this example, is grown into a thick film (100 μm) on a substrate made of a different material. With the substrate of the different material being removed, a nitride semiconductor substrate made of GaN with a thickness of 80 μm is used. Detailed process of forming the substrate is as follows. A substrate of different material made of sapphire with the principal plane lying in the C plane having diameter of 2 inches is set in a MOVPE reaction vessel, of which temperature is set to 500° C., and a buffer layer made of GaN is formed to a thickness of 200 Å by using trimethyl gallium (TMG) and ammonia ($NH_3$). With the temperature raised, a film of undoped GaN 1.5 μm is grown as a base layer. Then with a plurality of striped masks formed on the base layer surface, a nitride semiconductor, GaN in this example, is selectively grown through apertures (windows) of the mask. The nitride semiconductor layer formed by a growing process involving lateral growth (ELOG) is further grown to become thicker. Then the nitride semiconductor substrate is obtained by removing the substrate of different material, the buffer layer and the base layer. At this time, the mask used in the selective growth is made of $SiO_2$ having mask width of 15 μm and aperture (opening) width of 5 μm.

(Buffer Layer 102)

With temperature set to 1050° C., a buffer layer 102 made of $Al_{0.05}Ga_{0.95}N$ is formed to a thickness of 4 μm on the nitride semiconductor substrate, which has been formed as described above, by using TMG (trimethyl gallium), TMA (trimethyl aluminum) and ammonia. This layer functions as a buffer layer between the n-type contact layer made of AlGaN and the nitride semiconductor substrate. Then layers which constitute the device structure are formed on the base layer made of nitride semiconductor.

Specifically, in the case of a substrate made of GaN formed by lateral growth, generation of pits can be decreased by using the buffer layer 102 made of nitride semiconductor $Al_aGa_{1-a}N$ (0<a≤1) which has thermal expansion coefficient smaller than that of GaN. Preferably the buffer layer is formed on the laterally grown layer of nitride semiconductor GaN. When the proportion of Al in the buffer layer 102 is in a range of 0<a<0.3, the buffer layer can be formed with good crystallinity. The buffer layer may be formed as an n-type contact layer, or the buffer layer 102 and the n-type contact layer 104 formed thereon may be caused to perform buffering effect by forming the n-type contact layer of the same composition as that of the buffer layer after forming the buffer layer 102. That is, as the buffer layer 102 of at least one layer is provided between the nitride semiconductor substrate which employed lateral growth or a laterally grown layer formed thereon and the device structure, or between the active layer in the device structure and the laterally grown layer (substrate) or the laterally grown layer (substrate) formed thereon, or more preferably between the lower cladding layer provided on the substrate side of the device structure and the laterally grown layer (substrate), generation of pits can be decreased and the device characteristics ca be improved. The buffer layer is capable of improving the crystallinity when forming the active layer, particularly the thick nitride semiconductor layer which includes In according to the present invention, it is preferable to provide the buffer layer.

(n-Type Contact Layer 103)

The n-type contact layer 103 made of $Al_{0.05}Ga_{0.95}N$ doped with Si is formed to a thickness of 4 μm at a temperature of 1050° C. on the buffer layer 102, which has been formed as described above, by using TMG, TMA, ammonia, and silane gas used as an impurity gas.

(Crack Preventing Layer 104)

Then a crack preventing layer 104 made of $In_{0.06}Ga_{0.95}N$ is formed to a thickness of 0.15 μm at a temperature of 800° C. by using TMG, TMI (trimethyl indium), and ammonia. The crack preventing layer may be omitted.

(n-Type Cladding Layer 105)

After growing a layer A made of undoped $Al_{0.05}Ga_{0.95}N$ to a thickness of 25 Å is grown at a temperature of 1050° C. by using TMA, TMG and ammonia as the stock material gas, supply of TMA is stopped and silane gas is used as the impurity gas, and a layer B made of GaN doped with Si in concentration of $5\times10^{18}/cm^3$ is formed to a thickness of 25 Å. This operation is repeated 200 times to stack the layer A and the layer B thereby to form the n-type cladding layer 106 made in multi-layered film (super lattice structure) having a total thickness of 1 μm. At this time, a difference in the refractive index which is sufficient for the cladding layer to function can be provided when the proportion of Al of the undoped AlGaN is in a range from 0.05 to 0.3.

(n-Type Optical Guide Layer 106)

Then at a similar temperature, an n-type optical guide layer 106 made of undoped GaN is formed to a thickness of 0.15 μm by using TMG and ammonia as the stock material gas. The n-type optical guide layer 107 may also be doped with an n-type impurity.

(Active Layer 107)

Then by setting the temperature to 800° C., a barrier layer (B) made of $In_{0.05}Ga_{0.95}N$ doped with Si in a concentration of $5\times10^{18}/cm^3$ is formed to a thickness of 140 Å by using TMI (trimethyl indium), TMG and ammonia as the stock material gas and silane gas as the impurity gas. Then the supply of silane gas is stopped and a well layer (W) made of undoped $In_{0.1}Ga_{0.95}N$ is formed to a thickness of 25 Å, while stacking the barrier layer (B) and the well layer (W) in the order of (B)/(W)/(B)/(W). Last, top barrier layer made of $In_{0.05}Ga_{0.95}N$ is formed to a thickness of 140 Å by using TMI (trimethyl indium), TMG and ammonia as the stock material gas. The active layer 107 becomes multiple quantum well structure (MQW) having total thickness of 470 Å.

(p-Type Electron Confinement Layer 108: First p-Type Nitride Semiconductor Layer)

Then at a similar temperature, a p-type electron confinement layer 108 made of $Al_{0.3}Ga_{0.7}N$ doped with Mg in a concentration of $1\times10^{19}/cm^3$ is formed to a thickness of 100 Å by using TMA, TMG and ammonia as the stock material gas and $Cp_2Mg$ (cyclopentadienyl magnesium) as the impurity gas. This layer may not be provided, though this would function as an electron confinement layer and help decrease the threshold when provided. In this case, the p-type impurity Mg diffuses from the p-type electron confinement layer 108 into the top barrier layer which is adjacent thereto so that the top barrier layer becomes doped with Mg of about 5 to $10\times10^{16}/cm^3$ (p-Type Optical Guide Layer 109)

Then by setting the temperature to 1050° C., a p-type optical guide layer 109 made of undoped GaN is formed to a thickness of 0.15 μm by using TMG and ammonia as the stock material gas. While the p-type optical guide layer 109 is grown as an undoped layer, diffusion of Mg from the adjacent layers such as the p-type electron confinement layer 108 and the p-type cladding layer 109 increases the Mg concentration to $5\times10^{16}/cm^3$ and turns the layer to p-type. Alternatively, this layer may be intentionally doped with Mg while growing.

(p-Type Cladding Layer 110)

Then a layer of undoped $Al_{0.05}Ga_{0.95}N$ is formed to a thickness of 25 Å at 1050° C., then supply of TMA is stopped and a layer of Mg-doped GaN is formed to a thickness of 25 Å by using $Cp_2Mg$. This operation is repeated 90 times to form the p-type cladding layer 110 constituted from super lattice structure of total thickness of 0.45 µm. When the p-type cladding layer is formed in super lattice structure consisting of nitride semiconductor layers of different band gap energy levels with at least one nitride semiconductor layer including Al being stacked one on another, crystallinity tends to be improved by doping one of the layers more heavily than the other, in the so-called modulated doping. In the present invention, however, both layers may be doped similarly. The cladding layer 110 is made of nitride semiconductor which includes Al, preferably in super lattice structure which includes $Al_xGa_{1-x}N$ (0<x<1), more preferably super lattice structure consisting of GaN and AlGaN stacked one on another. Since the p-type cladding layer 110 formed in the super lattice structure makes it possible to increase the proportion of Al in the entire cladding layer, refractive index of the cladding layer can be decreased. Also because the band gap energy increases, it is very effective in reducing the threshold value. Moreover, since pits generated in the cladding layer can be reduced by the super lattice structure compared to a case without super lattice structure, occurrence of short-circuiting is also reduced.

(p-Type Contact Layer 111)

Last, at a temperature of 1050° C., a p-type contact layer 111 made of p-type GaN doped with Mg in a concentration of $1 \times 10^{20}/cm^3$ is formed to a thickness of 150 Å on the p-type cladding layer 110. The p-type contact layer 111 may be formed from p-type $In_xAl_yGa_{1-x-y}N$ (0≤X, 0≤Y, X+Y≤1), and preferably from Mg-doped GaN which achieves the best ohmic contact with the p-type electrode 120. Since the contact layer 111 is the layer where the electrode is to be formed, it is desirable to have a high carrier concentration of $1 \times 10^{17}/cm^3$ or higher. When the concentration is lower than $1 \times 10^{17}/cm^3$, it becomes difficult to achieve satisfactory ohmic contact with the electrode. Forming the contact layer in a composition of GaN makes it easier to achieve satisfactory ohmic contact with the electrode. After the reaction has finished, the wafer is annealed in nitrogen atmosphere at 700° C. in the reaction vessel thereby to further decrease the electrical resistance of the p-type layer.

After forming the nitride semiconductor layers one on another as described above, the wafer is taken out of the reaction vessel. Then a protective film of $SiO_2$ is formed on the surface of the top-most p-type contact layer, and the surface of the n-type contact layer 103 whereon the n-type electrode is to be formed is exposed as shown in FIG. 1 by etching with $SiCl_4$ gas in the RIE (reactive ion etching) process. For the purpose of deep etching of the nitride semiconductor, $SiO_2$ is best suited as the protective film.

Then ridge stripe is formed as the striped waveguide region described above. First, a first protective film 161 having thickness of 0.5 µm is formed from Si oxide (mainly $SiO_2$) over substantially the entire surface of the top-most p-type contact layer (upper contact layer) by means of a PDP apparatus. Then the first protective film 161 is patterned with stripe width of 1.6 µm with a mask of a predetermined configuration being placed thereon by means of photolithography process and the RIE (reactive ion etching) apparatus which employs $CF_4$ gas. At this time, height of the ridge stripe (depth of etching) is set so that thickness of the p-type optical guide layer 109 becomes 0.1 µm by partially etching the p-type contact layer 111, the p-type cladding layer 109 and the p-type optical guide layer 110.

After forming the ridge stripe, a second protective layer 162 made of Zr oxide (mainly $ZrO_2$) is formed on the first protective layer 161 to a thickness of 0.5 µm continuously over the first protective layer 161 and the p-type optical guide layer 109 which has been exposed by etching.

After forming the second protective film 162, the wafer is subjected to heat treatment at 600° C. When the second protective film is formed from a material other than $SiO_2$, it is preferable to apply heat treatment at a temperature not lower than 300° C., preferably 400° C. or higher but below the decomposition temperature of the nitride semiconductor (1200° C.) after forming the second protective film, which makes the second protective film less soluble to the material (hydrofluoric acid) that dissolves the first protective film, thus it is desirable to add this process.

Then the wafer is dipped in hydrofluoric acid to remove the first protective film 161 by the lift-off process. Thus the first protective film 161 provided on the p-type contact layer 111 is removed thereby to expose the p-type contact layer. The second protective film 162 is formed on the side faces of the ridge stripe and the plane which continues therefrom (exposed surface of the p-type optical guide layer 109) as shown in FIG. 1.

After the first protective film 161 provided on the p-type contact layer 112 is removed as described above, a p-type electrode 120 made of Ni/Au is formed on the surface of the exposed p-type contact layer 111 as shown in FIG. 1. The p-type electrode 120 is formed with stripe width of 100 µm over the second protective film 162 as shown in FIG. 1. After forming the second protective film 162, an n-type electrode 121 made of Ti/Al in stripe configuration is formed in a direction parallel to the stripe on the n-type contact layer 103 which has been already exposed.

Then the surface of a desired region which has been exposed by etching where lead-out electrodes for the p-type and n-type electrodes are to be formed is masked, and a multi-layered dielectric film 164 made of $SiO_2$ and $TiO_2$ are formed. Lead-out electrodes 122, 123 made of Ni—Ti—Au (1000 Å-1000 Å-8000 Å) are formed on the p-type and n-type electrodes. At this time, the active layer 107 is formed with a width of 200 µm (width in the direction perpendicular to the resonator direction). The multi-layered dielectric film made of $SiO_2$ and $TiO_2$ are formed also on the resonator surface (reflector side).

After forming the n-type and p-type electrodes as described above, the wafer is divided into bar shape along M plane (M plane of GaN, (11-00) or the like) of the nitride semiconductor in the direction perpendicular to the striped electrode. The wafer of bar shape is further divided to obtain laser devices with the resonator length being 650 µm.

The laser device made as described above has the staking structure 20 shown in FIG. 7 and shows the band gap energy diagram, and corresponds to the first, second, fourth and fifth embodiments. When dividing the wafer into bars, the wafer may be cleaved along the waveguide interposed between etched end faces with the cleavage surface being used as the resonator surface, or may be cleaved at a position other than the waveguide with the etched end faces being used as the resonator surface, or one of the etched end faces and a cleavage surface may be used as a pair of resonator surfaces. While a reflecting film made of a multi-layered dielectric film is provided on the resonator surface of the etched end faces, a reflecting film may also be provided on the resonator surface of the cleavage surface after cleaving. The reflecting film may be made of at least one selected from among a group consisting of $SiO_2$, $TiO_2$, $ZrO_2$, ZnO, $Al_2O_3$, MgO and polyimide. The reflecting film may also comprise multiple films each having a thickness of λ/4n (λ is the wavelength and n is the refractive index) stacked one on another, or may comprise a single layer, and may also be made function as a surface protective film which prevents the resonator end faces from being exposed, as well as the reflecting film. To function as a surface protective film, the film may be made in a thickness of λ/2n. Such a laser device may also be made as only the n-electrode forming surface (m-type contact layer) is exposed without forming the etching end face in the device manufacturing process, and a pair of cleavage surfaces are used as the resonator surfaces.

When dividing the bar-shaped wafer, too, cleavage surface of the nitride semiconductor (single substrate) may be used. Alternatively, the bar may be cleaved in M plane and A plane ({1010}), of the nitride semiconductor (GaN) perpendicular to the cleavage surface which is made when cleaving into the bar, approximated by hexagonal system, thereby to obtain chips. Also the A plane of the nitride semiconductor may be used when cleaving into bars.

A laser device capable of continuous oscillation at 405 nm with output power of 5 to 30 mW and threshold current density of 2.8 $kA/cm^2$ at the room temperature can be made. The laser device thus obtained has lifetime of 2000 to 3000 hours which is two to three times that of Comparative Example 1 operating with continuous oscillation with output of 5 mW at 60° C. Reverse withstanding voltage of this device was compared with that of Comparative Example 1. Many of the laser devices were not destroyed and when the voltage was raised to 100 V, some were not destroyed showing the reverse withstanding voltage characteristic about twice higher than that of Comparative Example 1.

EXAMPLE 2

Laser devices are made similarly to Example 1 except for the barrier layers located in the interface between the active layer and the p-type electron confinement layer (last-stacked barrier layer and barrier layer nearest to the p side), among the barrier layers provided in the active layer, are doped Mg in concentration of $1\times10^{18}/cm^3$. The laser device thus obtained has the last barrier layer doped with Mg more heavily than in the case of Example 1, and has lifetime and reverse withstanding voltage characteristic of similar level.

EXAMPLE 3

Laser devices are made similarly to Example 1 except for the active layer is formed as described below.
(Active Layer 107)
A barrier layer (B) made of $In_{0.05}Ga_{0.95}N$ doped with Si in a concentration of $5\times10^{18}/cm^3$ is formed to a thickness of 140 Å at a temperature of 800° C. by using TMI (trimethyl indium), TMG and ammonia as the stock material gas and silane gas as impurity gas. Then the supply of silane gas is stopped and a well layer (W) made of undoped $In_{0.1}Ga_{0.9}N$ is formed to a thickness of 40 Å, while stacking the barrier layer (B) and the well layer (W) in the order of (B)/(W)/(B)/(W). Last, the last barrier layer made of undoped $In_{0.05}Ga_{0.95}N$ is formed by using TMI (trimethyl indium), TMG and ammonia as the stock material gas. The active layer 107 becomes multiple quantum well structure (MQW) having total thickness of 500 Å.

A laser device capable of continuous oscillation at a wavelength of 405 nm with output power of 5 to 30 mW and threshold current density of 2.8 $kA/cm^2$ at the room temperature can be made. The laser device thus obtained has lifetime of 5000 to 6000 hours in operation of continuous oscillation with output of 5 mW at 60° C. Reverse withstanding voltage of this device was compared with that of Comparative Example 1. This is equivalent to a lifetime near 100 thousand hours at the room temperature. The reverse withstanding voltage is about 45V.

EXAMPLE 4

Laser devices are made similarly to Example 1 except that the barrier layers in the interface between the active layer and the p-type electron confinement layer (last barrier layer), among the barrier layers provided in the active layer, are doped Mg in concentration of $1\times10^{18}/cm^3$. The laser device thus obtained has the last barrier layer doped with Mg more heavily than in the case of Example 1, and has lifetime and reverse withstanding voltage characteristic of similar level.

EXAMPLE 5

In Example 1, thickness of the well layer is set to 55 Å. The laser device has lifetime significantly longer than that of Example 1, lasting for 1000 to 2000 hours in continuous oscillation with output power of 30 mW at 50° C.

When thickness of the well layer is increased to 60, 80 and 90 Å in Example 1, lifetime of the device rends to increase roughly in proportion to the thickness. At the same time, increases in the value of Vf and threshold current are observed as a result of the increase in the total thickness of the active layer as the well layer becomes thicker. In any of these cases, however, very long lifetime of the device is achieved in comparison to Comparative Example 1. With regards to Vf and threshold current, while definite conclusion cannot be drawn because these characteristics are related to the total thickness of the active layer and depend on the stacking structure, these characteristics do not depend much on the change in the thickness of the well layer in case the number of well layers is 2, which is the least number of well layers in multiple quantum well structure, and increases in the value of Vf and threshold current are kept at low levels, namely insignificant amounts of increase over Example 1, never resulting in a serious degradation of the device characteristics during continuous oscillation of the LD. To sum up, device characteristics can be improved when the thickness of the well layer is 40 Å or larger, and device lifetime can be increased significantly when the thickness is 50 Å or larger. When the thickness of the well layer is 50 Å or larger, oscillation with output power of 80 mW can be achieved with some devices achieving an output of 100 mW.

EXAMPLE 6

When the thickness of the last barrier layer (barrier layer located at the topmost position) is increased to 150 Å in Example 1, a device having lifetime longer than that of Example 1 was obtained. This is supposedly because, as shown in FIGS. 9A and 9B, the increasing thickness of the topmost barrier layer 2c, which means increasing distance $d_B$ between the well layer 1b and the p-type electron confinement layer 28, keeps the well layer from the first p-type nitride semiconductor layer (p-type electron confinement layer) that has a high resistance and is expected to be heated to a higher temperature than the other layers during operation of the device, thereby protecting the well layer from the adverse effect of the high temperature and allows laser oscillation with better oscillation characteristics.

EXAMPLE 7

In Example 1, the active layer is made in such a structure as barrier layer, well layer, barrier layer and well layer stacked in this order with the barrier layer having thickness of 70 Å, with a barrier layer 140 Å thick provided at the end. Lifetime of the device when operated under conditions of continuous oscillation with output of 30 mW at 50° C. is shown in FIG. 12 with the thickness of the well layer being changed as 22.5 Å, 45 Å, 90 Å and 130 Å. As will be clear from the drawing, the thicker the well layer becomes, the longer the lifetime of the device, thus making a laser device of longer lifetime. When the thickness of the well layer is 22.5 Å, 45 Å, 90 Å or 130 Å, oscillation of 30 mW or high output power can be made similarly to the case of Example 5, and laser device having output power of 80 to 100 mW can be achieved when the thickness is 90 Å or 130 Å.

EXAMPLE 8

In Example 1, the active layer is made in such a structure as barrier layer, well layer, barrier layer and well layer stacked in this order with the well layer having thickness of 45 Å, with a barrier layer 140 Å thick provided at the end. Lifetime of the device when operated under conditions of continuous oscillation with output of 30 mW at 50° C. is shown in FIG. 13 with the thickness of the barrier layer other than last barrier being changed as 22.5 Å, 45 Å, 90 Å and 130 Å. As will be clear from the drawing, when the thickness of the barrier layer is increased, device lifetime remains substantially constant with the thickness around 50 Å and larger. Thus satisfactory device lifetime can be made of the nitride semiconductor device of the present invention when the barrier layer 40 Å or higher.

EXAMPLE 9

Laser devices are obtained similarly to Example 1 except for setting the proportion of Al in the AlGaN layer of the multi-layered cladding layer to 0.1. The laser devices obtained have mean proportion of Al being 0.05 in the cladding layer, with self-excited oscillation being observed in some of them during continuous oscillation in the single mode with 30 mW. When the proportion of Al in the AlGaN layer of the multi-layered cladding layer to 0.15, mean proportion of Al in the cladding layer becomes 0.78, and the probability of self-excited oscillation to occur becomes higher than in the case where mean proportion of Al is 0.05. Thus a laser device free of self-excited oscillation can be obtained by setting the proportion of Al in the cladding layer to 0.05 or lower, preferably 0.025 or lower, or 0.03 or lower.

EXAMPLE 10

Laser devices are obtained similarly to Example 1 except for growing the topmost barrier layer (barrier layer disposed nearest to the p-type layer side) to a thickness of 150 Å. The laser device thus obtained shows a tendency of the device lifetime becoming slightly longer than Example 1. On the contrary, the laser device having the topmost barrier layer of 100 Å in thickness has lifetime significantly shorter than that of Example 1.

EXAMPLE 11

Laser devices are obtained similarly to Example 1 except for providing the p-type optical guide layer 109 directly on the active layer 107 without providing the p-type electron confinement layer 108. The laser device thus obtained has the value of Vf about 1V lower, although the threshold current increases sharply and some of the laser devices are difficult to oscillate. This is supposedly because the absence of the first p-type nitride semiconductor layer (p-type electron confinement layer 108) of high resistance decreases the value of Vf and makes it difficult to confine electrons in the active layer, thus leading to sharp increase in the threshold.

EXAMPLE 12

Laser devices are obtained similarly to Example 1 except for making the active layer in a stacked structure of three well layers and four barrier layers. The laser device thus obtained has the value of Vf higher than that of Example 1 because the active layer becomes thicker as a whole, and the threshold current also becomes slightly higher due to the larger number of the well layers. When the active layer is made by stacking five barriers and four well layers alternately with a barrier layer at the end, the threshold current the value of Vf become higher than in the case where the number of well layers is 2 or 3.

In FIG. 4, when the first barrier layer (second n side barrier layer) 2*a* and the last barrier layer (first p side barrier layer) 2*d* are grown to thickness of 140 Å and the barrier layers 2*b*, 2*c* are grown to thickness of 100 Å (structure of the active layer shown in FIG. 5), variations in the device characteristics, particularly variations in the lifetime among the chips become less than in the case shown in FIG. 5, thus providing laser devices of better device characteristics.

COMPARATIVE EXAMPLE 1

Laser devices are obtained similarly to Example 1 except that all barrier layers in the active layer are doped with Si. The laser devices thus obtained have lifetime of 1000 hours in continuous oscillation with output power of 5 mW at 60° C. In the evaluation of the reverse withstanding voltage, most of the laser devices thus obtained are destroyed when subjected to reverse voltage of 50V. Device lifetime and reverse withstanding voltage of the devices having the last barrier layer in the active layer being doped with Si in concentrations of $1\times10^{17}/cm^3$, $1\times10^{18}/cm^3$ and $1\times10^{19}/cm^3$ are shown in FIGS. 14, 15. In the graph, the plot noted as undoped corresponds to the data of Example 1. As will be clear from the graphs, doping the barrier layer disposed nearest to the p-type layer side in the active layer with Si causes the device lifetime and reverse withstanding voltage to decrease, resulting in degradation of the device characteristic in proportion to the concentration of doping.

In an analysis of the laser devices thus obtained with SIMS (secondary ion mass spectroscopy analysis), Si and Mg are detected in the topmost barrier layer disposed in the interface with the p-type electron confinement layer among the barrier layers in the active layer (barrier layer located at a position nearest to the p-type layer). Thus the laser devices obtained has the topmost barrier layer doped with Si and Mg, which is believed to be the cause of the significantly lower characteristics than the laser device obtained in Example 1. However, as shown in FIGS. 14, 15, concentration of Mg doping does not change when the concentration of Si doping is changed, the degradation in the device characteristics is supposedly caused mainly by n-type impurity.

EXAMPLE 13

In Example 1, laser devices are obtained by using an active layer 407 described below with reference to FIG. 10 instead of the active layer 107.

(Active Layer 407)

By setting the temperature to 880° C., a first barrier layer 401a made of $In_{0.01}Ga_{0.99}N$ doped with Si in a concentration of $5\times10^{18}/cm^3$ is formed to a thickness of 100 Å by using TMI, TMG and ammonia as the stock material gas and silane gas as the impurity gas. Then with the temperature lowered to 820° C., the supply of silane gas is stopped and a well layer 402a made of undoped $In_{0.3}Ga_{0.7}N$ is formed to a thickness of 50 Å. At the same temperature, a second barrier layer 403a made of undoped $Al_{0.3}Ga_{0.7}N$ is formed to a thickness of 10 Å using TMA. The 3-layer structure of the first barrier layer 401a, the well layer 402a and the second barrier layer 403a is repeated so as to stack layers 401b, 402b and 403b, with a topmost barrier layer 404 made of undoped $In_{0.01}Ga_{0.99}N$ being formed to a thickness of 140 Å at the end, thereby forming an active layer 407 of multiple quantum well structure (MQW) having total thickness of 460 Å. At this time, p-type impurity Mg diffuses from the adjacent p-type electron confinement layer 108 into the topmost barrier layer 404 located at a position nearest to the p-type layer, thus making the barrier layer which includes Mg. Thus a laser device having high output power and long lifetime and emitting light of wavelength 470 nm is obtained. At this time, the second barrier layer provided on top of the well layer is made of a nitride semiconductor which includes Al, preferably a nitride semiconductor having a composition of $Al_zGa_{1-z}N$ ($0<z\leq1$), which is supposed to have an effect of forming proper unevenness in the well layer and cause segregation of In or distribution in concentration, thus resulting in quantum dot or quantum wire, thereby providing a nitride semiconductor device having higher output power than the case without the second barrier layer. At this time, proper unevenness tends to be formed in the well layer when the proportion z of Al is not less than 0.3. Similar effect can be achieved when the second barrier layer is provided not in contact with the well layer. It is also preferable that the barrier layer provided below the well layer in contact therewith does not include Al as in the case of the first barrier layer, because this enables it to form the well layer with good crystallinity.

EXAMPLE 14

A light emitting device shown in FIGS. 9A and 9B is manufactured as follows.

A substrate made of sapphire (C plane) is set in a MOVPE reaction vessel, with the substrate temperature raised to 1050° C. while flowing hydrogen, and the substrate is cleaned.

(Buffer Layer 302)

With the temperature lowered to 510° C., a buffer layer 302 made of GaN is formed to a thickness of 150 Å on the substrate 301 by using hydrogen as the carrier gas, and ammonia, TMG (trimethyl gallium), TMA (trimethyl aluminum) as the stock material gas.

(Base Layer 303)

After growing the buffer layer 302, supply of only the TMG is stopped and the temperature is raised to 1050° C. At the temperature of 1050, a base layer 303 made of undoped GaN is grown to a thickness of 1.5 μm using TMG and ammonia gas as the stock material gas. The base layer serves as the substrate whereon to grow the nitride semiconductor.

(n-Type Contact Layer 304)

Then an n-type contact layer 304 made of GaN doped with Si in concentration of $4.5\times10^{18}/cm^3$ is formed to a thickness of 2.25 μm at a temperature of 1050° C. by using TMG and ammonia as the stock material gas, and silane gas as an impurity gas.

(n-Type First Multi-Layered Film Layer 305)

Then with supply of only the silane gas stopped, a base layer 305a made of undoped GaN is formed to a thickness of 3000 Å at a temperature of 1050° C. using TMG and ammonia gas, followed by the growth of an intermediate layer 305b made of GaN doped with Si in concentration of $4.5\times10^{18}/cm^3$ to a thickness of 300 Å at the same temperature by adding the silane gas. Then again with supply of only the silane gas stopped, an upper layer 305c made of undoped GaN is formed to a thickness of 50 Å at the same temperature, thereby forming a first multi-layered film layer 305 consisting of three layers 304a, 305b and 304c with total thickness of 3350 Å.

(N-Type Second Multi-Layered Film Layer 306)

Then at roughly the same temperature, the second nitride semiconductor layer made of undoped GaN is grown to a thickness of 40 Å, followed by the growth of the first nitride semiconductor layer made of undoped $In_{0.13}Ga_{0.87}N$ to a thickness of 20 Å at 800° C. using TMG, TMI and ammonia. This operation is repeated to stack the second nitride semiconductor layer and the first nitride semiconductor layer alternately ten times in this order. Last, the second nitride semiconductor layer made of GaN is grown to a thickness of 40 Å, thereby forming the n-type second multi-layered film layer 306 of super lattice structure having thickness of 640 Å.

(Active Layer 307)

A barrier layer made of GaN is grown to a thickness of 250 Å, followed by the growth of well layer made of undoped $In_{0.3}Ga_{0.7}N$ to a thickness of 30 Å at 800° C. using TMG, TMI and ammonia. By stacking seven barrier layers and six well layers alternately in such a constitution as barrier layer $B_1$/well layer/barrier layer $B_2$/well layer/barrier layer $B_3$/well layer/barrier layer $B_4$/well layer/barrier layer $B_5$/well layer/barrier layer $B_6$/well layer/barrier layer $B_7$, thereby forming the active layer 307 of multi-quantum well structure having total thickness of 1930 Å. At this time, the barrier layers $B_1$, $B_2$ are doped with Si in concentration of $1\times10^{17}/cm^3$ and the other barrier layers $B_i$ (i=3, 4, . . . , 7) are grown undoped.

(p-Type Multi-Layered Cladding Layer 308)

A third nitride semiconductor layer made of $Al_{0.2}Ga_{0.8}N$ doped with Mg in a concentration of $1\times10^{20}/cm^3$ is formed to a thickness of 40 Å at 1050° C. by using TMG, TMA, ammonia and $Cp_2Mg$ (cyclopentadienyl magnesium) as the impurity gas. Then with the temperature being set to 800° C., a fourth nitride semiconductor layer made of $In_{0.03}Ga_{0.97}N$ doped with Mg in a concentration of $1\times10^{20}/cm^3$ is grown to a thickness of 25 Å by using TMG, TMI, ammonia and $Cp_2Mg$. These operations are repeated to stack the third nitride semiconductor layer and the fourth nitride semiconductor layer alternately five times in this order, with one layer of the third nitride semiconductor layer having thickness of 40 Å being grown at the end. Thus the p-type multi-layered cladding layer 308 of super lattice structure having thickness of 365 Å is formed.

(p-Type GaN Contact Layer 310)

Then with the temperature being set to 1050° C., a p-type contact layer 310 made of p-type GaN doped with Mg in a concentration of $1\times10^{20}/cm^3$ is grown to a thickness of 700 Å by using TMG, ammonia and $Cp_2Mg$.

Upon completion of the reaction, the temperature is lowered to the room temperature, and the wafer is annealed at 700° C. in nitrogen atmosphere within the reaction vessel, thereby to decrease the resistance of the p-type layer.

After annealing, the wafer is taken out of the reaction vessel. A mask of a predetermined shape is formed on the surface of the p-type contact layer 310 provided on the top, and the p-type contact layer is etched in an RIE (reactive ion etching) apparatus, thereby exposing the n-type contact layer 4 as shown in FIGS. 9A and 9B.

After etching, a p-type electrode 311 which transmits light made of a material including Ni and Au is formed to a thickness of 200 Å over substantially the entire surface of the p-type contact layer 310 provided on the top, and a p-type pad electrode made of Au for bonding is formed to a thickness of 0.5 μm on the p-type electrode 11. On the other hand, an n-type electrode 312 which includes W and Al is formed on the surface of the n-type contact layer 304 which has been exposed by etching, thereby to obtain a light emitting device. In the light emitting device thus obtained, since the barrier layer $B_1$ which is located nearest to the n-type layer and the next barrier layer $B_2$ are doped with an n-type impurity, the carrier from the n-type layer is efficiently injected deep into the active layer (toward the p-type layer), thereby improving the photo-electric conversion efficiency, decreasing the value of Vf and the leak current, and increasing the light emission output power compared to Comparative Example 2 wherein all the barrier layers are grown undoped.

EXAMPLE 15

Light emitting devices are obtained similarly to the Example 14 except that the barrier layer $B_7$ located nearest to the p-type layer is doped with Mg as a p-type impurity in concentration of $1 \times 10^{18}/cm^3$ in the Example 14. In the light emitting device thus obtained, since the topmost barrier layer $B_7$ has a p-type impurity, the carrier from the p-type layer is efficiently injected, thereby improving the photo-electric conversion efficiency, and increasing the light emission output power compared to Example 14.

COMPARATIVE EXAMPLE 2

Light emitting devices are obtained similarly to Example 14 except that all the barrier layers and the well layers in the active layer are grown undoped in Example 14. The light emitting devices thus obtained have lower light emission output power and shorter lifetime than those of Example 14.

EXAMPLE 16

Figure 11:
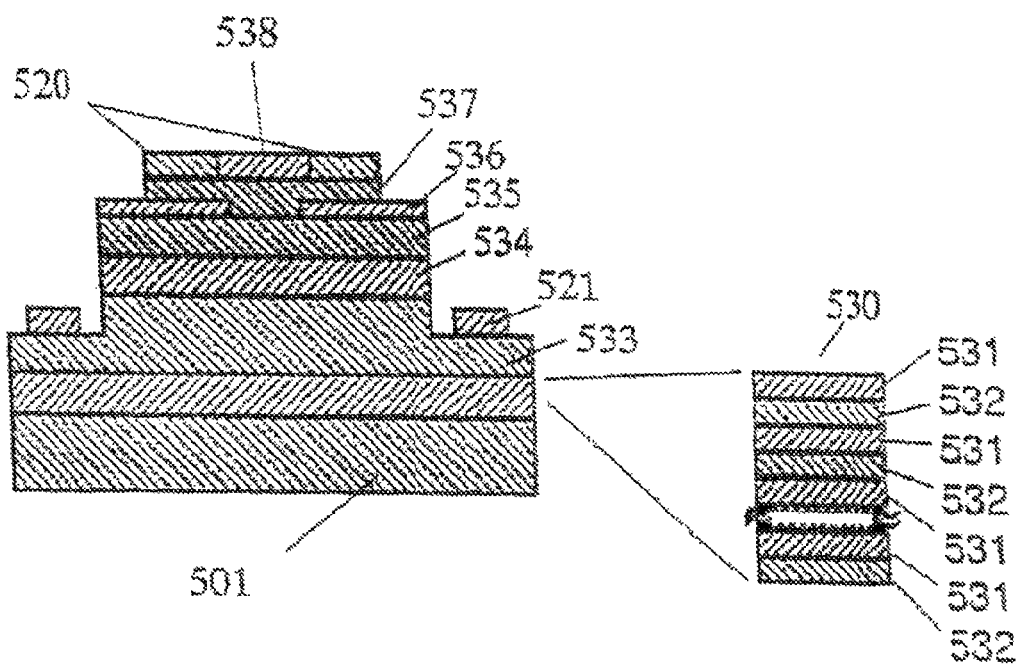
FIG. 11 is a schematic sectional view showing one embodiment of the present invention.

A plane emission type laser device shown in FIG. 11 will be described below.
(Substrate 501)
A substrate 501 similar to the nitride semiconductor substrate 101 used in Example 1 is used.

A reflecting film 530 is formed by stacking a first layer 531 made of AlN and a second layer 532 made of GaN alternately three times on the nitride semiconductor substrate 501. Each of the stacked layers is formed to a thickness of λ/4n (λ is the wavelength and n is the refractive index) wherein n is set to 2 (AlN) or 2.5 (GaN) with the thickness being about 500 Å for the first layer and 400 Å for the second layer. At this time, the reflecting film may comprise the first and the second layers made of nitride semiconductor represented by $In_xAl_yGa_{1-x-y}N$ ($0 \leq x \leq 1$, $0 \leq y \leq 1$, $x+y=1$), while the first and the second layers of the reflecting film made of nitride semiconductor are preferably multi-layered film formed by stacking nitride semiconductors of different compositions represented by $Al_xGa_{1-x}N$ ($0 \leq x \leq 1$). At this time, each layer is formed once or more, and one or more pairs of the first layer and the second layer are formed. Specifically, the pair of the first layer and the second layer may be formed in such a constitution as AlGaN/AlGaN, GaN/AlGaN, AlGaN/AlN or GaN/AlN. Composition of $Al_xGa_{1-x}N/Al_yGa_{1-y}N$ ($0<x$, $x<y<1$) is a multi-layered film of AlGaN and is therefore capable of decreasing the difference in the thermal expansion coefficient and achieve good crystallinity. Composition of $GaN/Al_yGa_{1-y}N$ ($0<y<1$) makes it possible to form a multi-layered film of GaN layer having improved crystallinity. When the difference in the proportion of Al (y−x) is increased, difference in the refractive index between the first layer and the second layer increases resulting in a higher reflectivity. Specifically, a multi-layered reflecting film of high reflectivity can be made by setting y−x≥0.3, preferably y−x≥0.5. Also similarly to Example 1, the multi-layered film made of $Al_yGa_{1-y}N$ ($0<y \leq 1$) functions as the buffer layer 102 and provides an effect of decreasing pits.

Then an n-type contact layer 533, an active layer 534, a p-type electron confinement layer (not shown) and a p-type contact layer 535 are stacked under conditions similar to those of Example 2 (well layer 55 Å), and a blocking layer 536 made of $SiO_2$ having a circular aperture is provided. A second p-type contact layer 537 is formed by growing Mg-doped GaN through the circular aperture. At this time, either one of the p-type contact layer 535 and the second p-type contact layer 537 may be formed. A multi-layered dielectric film made of $SiO_2/TiO_2$ is formed on the second p-type contact layer 537 to make a reflecting film 538, which is provided on the aperture of the blocking layer 536 in a circular configuration. Then the p-type contact layer 535 is exposed by etching, and a ring-shaped n-type electrode 421 is formed on the p-type contact layer 535 which has been exposed and a p-type electrode 520 which surrounds the reflecting film 538 is formed on the second p-type contact layer 537. The planar emission type laser device thus obtained has excellent device lifetime and high output power similar to that of Example 2.

EXAMPLE 17

Laser devices are obtained similarly to Example 1 except that the active layer and the p-type cladding layer are formed as described below.
(Active layer 107)

A barrier layer (B) made of $In_{0.05}Ga_{0.95}N$ doped with Si in a concentration of $5 \times 10^{18}/cm^3$ is formed to a thickness of 70 Å. Then the supply of silane gas is stopped and a well layer (W) made of undoped $In_{0.15}Ga_{0.9}N$ is formed to a thickness of 70 Å, while stacking the barrier layer (B) and the well layer (W) in the order of (B)/(W)/(B)/(W). Last, topmost barrier layer made of undoped $In_{0.05}Ga_{0.95}N$ is formed to a thickness of 150 Å by using TMI (trimethyl indium) as the stock material gas. The active layer 107 becomes multiple quantum well structure (MQW) having total thickness of 430 Å.
(p-Type Cladding Layer 110)

Then a layer of undoped $Al_{0.10}Ga_{0.95}N$ is formed to a thickness of 25 Å and a layer of Mg-doped GaN is formed to a thickness of 25 Å. This operation is repeated 90 times to form the p-type cladding layer 110 constituted from super lattice structure of total thickness of 0.45 μm.

In the laser device obtained as described above, ratio Rt of the barrier except for the barrier layer located nearest to the p-type layer in the active layer and the well layer is 1, satisfying the relationship between the well layer thickness and the device lifetime shown in FIG. 12. Thus a laser device having high output power and long lifetime can be provided. Also as the thickness of the barrier layer (the n side barrier layer or the barrier layer sandwiched by the well layers) is decreased, a laser device having excellent response characteristic and RIN is provided for an optical disk system. Also as the proportion of Al in the p-type cladding layer is increased, difference in the refractive index thereof from that of the buried layer 162 becomes smaller, resulting in a laser device of effective refractive index type having less confinement in the lateral direction which is free from kink even in a high output region. It is preferable to provide the p-type cladding layer which has the mean composition of $Al_xGa_{1-x}N$ in mean proportion x being in a range of $0<x\leq0.1$. This suppresses the kink formation in the laser device.

According to the present invention, a nitride semiconductor device having excellent device lifetime and high output power can be obtained where the reverse withstanding voltage, of which weak characteristic of a device made of nitride semiconductor has been a problem in the prior art, is improved. When the nitride semiconductor device of the present invention is applied to laser device, a laser device having the improved characteristics similarly to those described above and is free from self-excited oscillation can be obtained.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A nitride semiconductor device comprising an active layer including a well layer and a barrier layer, an n-type nitride semiconductor layer and a p-type nitride semiconductor layer, said active layer being sandwiched by said n-type nitride semiconductor layer and said p-type nitride semiconductor layer,
    wherein said well layer comprising a nitride semiconductor including In, and said barrier layer comprising a nitride semiconductor including In with the proportion of In being lower than that of the first layer, GaN or a nitride semiconductor including Al,
    wherein $d_1$ is a distance between said well layer closest to said p-type nitride semiconductor layer and said p-type nitride semiconductor layer and $d_2$ is a distance between said well layer closest to said n-type nitride semiconductor layer and said n-type nitride semiconductor layer, and
    wherein the $d_1$ is more than 150 angstroms and is larger than the $d_2$.

2. The nitride semiconductor layer according to claim 1, wherein said active layer includes two or more well layers and $d_3$ is a distance between adjacent well layers, and wherein the $d_3$ is smaller than the $d_1$ and $d_2$.

3. The nitride semiconductor layer according to claim 2, wherein the number of said well layers is not more than three.

4. The nitride semiconductor layer according to claim 1, wherein said p-type nitride semiconductor layer comprises AlGaN layer.

5. The nitride semiconductor layer according to claim 1, wherein said n-type nitride semiconductor layer comprises AlGaN layer.

6. The nitride semiconductor layer according to claim 1, wherein a ridge strip is formed in said p-type nitride semiconductor layer.

7. A nitride semiconductor device comprising an active layer including a well layer and a barrier layer, a n-side nitride semiconductor layer including Al and a p-side nitride semiconductor layer including Al, said active layer being sandwiched by said n-side nitride semiconductor layer including Al and said p-side nitride semiconductor layer including Al,
    wherein said well layer comprising a nitride semiconductor including In, and said barrier layers comprising a nitride semiconductor including In with the proportion of In being lower than that of the first layer or GaN,
    wherein said p-side nitride semiconductor layer including Al is doped with Mg,
    wherein $d_1$ is a distance between said well layer closest to said p-side nitride semiconductor layer including Al and said p-side nitride semiconductor layer including Al, $d_2$ is a distance between said well layer closest to said n-side nitride semiconductor layer including Al and said n-side nitride semiconductor layer including Al, and
    wherein the $d_1$ is more than 150 angstrom and is larger than the $d_2$.

8. The nitride semiconductor layer according to claim 7, wherein said active layer includes two or more well layers and $d_3$ is a distance between adjacent well layers; and wherein the $d_3$ is smaller than the $d_1$ and $d_2$.

9. The nitride semiconductor layer according to claim 8, wherein the number of said well layers is not more than three.

10. The nitride semiconductor layer according to claim 7, wherein said n-side nitride semiconductor layer including Al is doped with Si, Ge or Sn.

11. The nitride semiconductor layer according to claim 7, wherein a ridge stripe is formed in said p-side nitride semiconductor layer including Al.

12. The nitride semiconductor layer according to claim 7, wherein an average mixed crystal ratio of Al of said p-side nitride semiconductor layer including Al is greater than an average mixed crystal ratio of Al of said n-side nitride semiconductor layer including Al.

13. The nitride semiconductor layer according to claim 12, wherein an average mixed crystal ratio x of Al of said p-side nitride semiconductor layer including Al is $0<x\leq0.1$.

14. The nitride semiconductor device according to claim 1, wherein said n-type nitride semiconductor layer, said active layer and said p-type nitride semiconductor layer are layered in sequence.

15. The nitride semiconductor device according to claim 1, wherein said p-type nitride semiconductor layer has an upper clad layer made of a nitride semiconductor that includes Al of which the average mixed crystal ratio x is in the range of $0\leq0.05$; said n-type nitride semiconductor layer has a lower clad layer made of a nitride semiconductor that includes Al of which the average mixed crystal ratio x is in the range of $0\leq0.05$; and the nitride semiconductor device has a laser device structure.

16. The nitride semiconductor device according to claim 1, wherein said electrons confinement layer is provided so as to contact a barrier layer nearest to said p-type nitride semiconductor layer and has been grown being doped with a p-type impurity of which concentration is higher than that of said barrier layer in said active layer.

17. The nitride semiconductor device according to claim 1, wherein the number of well layers in said active layer is from 1 to 3.

18. The nitride semiconductor device according to claim 1, in said active layer said second barrier layer is arranged between well layers and the film thickness ratio Rt ([film thickness of a well layer]/[film thickness of a barrier layer]) of said well layer to the second barrier layer is in the range of $0.5\leq Rt\leq3$.

19. The nitride semiconductor device according to claim 1, wherein the film thickness dw of said well layer is in the range of 40 Å $1\leq dw \leq100$ Å while the film thickness db of said second barrier layer is in the range of $db\leq40$ Å.

20. The nitride semiconductor device according to claim 1, wherein said p-type nitride semiconductor layer has an upper clad made of a nitride semiconductor that includes Al and said n-type nitride semiconductor has a lower clad layer made of a nitride semiconductor, wherein the average mixed crystal ratio of Al in the upper clad layer is greater than that of the lower clad layer.

* * * * *